United States Patent
Takazaki

(10) Patent No.: US 9,869,011 B2
(45) Date of Patent: Jan. 16, 2018

(54) HARD DECORATIVE MEMBER HAVING GRAY-TONE LAYER

(71) Applicants: CITIZEN HOLDINGS CO., LTD., Tokyo (JP); CITIZEN WATCH CO., LTD., Tokyo (JP)

(72) Inventor: Kotaro Takazaki, Sayama (JP)

(73) Assignee: CITIZEN WATCH CO., LTD., Nishitokyo-shi, Tokyo (JP)

( * ) Notice: Subject to any disclaimer, the term of this patent is extended or adjusted under 35 U.S.C. 154(b) by 0 days.

(21) Appl. No.: 14/779,150

(22) PCT Filed: Mar. 19, 2014

(86) PCT No.: PCT/JP2014/057578
§ 371 (c)(1),
(2) Date: Sep. 22, 2015

(87) PCT Pub. No.: WO2014/156897
PCT Pub. Date: Oct. 2, 2014

(65) Prior Publication Data
US 2016/0053360 A1 Feb. 25, 2016

(30) Foreign Application Priority Data
Mar. 29, 2013 (JP) .................................. 2013-071561

(51) Int. Cl.
*B32B 15/04* (2006.01)
*C23C 14/00* (2006.01)
(Continued)

(52) U.S. Cl.
CPC ........ *C23C 14/0015* (2013.01); *A44C 27/006* (2013.01); *C23C 14/0036* (2013.01); *C23C 14/0635* (2013.01)

(58) Field of Classification Search
None
See application file for complete search history.

(56) References Cited

U.S. PATENT DOCUMENTS 4,226,082 A * 10/1980 Nishida ............... C23C 14/0015
368/285
5,192,410 A * 3/1993 Ito ........................... C23C 28/04
204/192.16

(Continued)

FOREIGN PATENT DOCUMENTS

| CN | 1556874 A | 12/2004 |
|---|---|---|
| CN | 101160418 A | 4/2008 |

(Continued)

OTHER PUBLICATIONS

Palmquist et al., "Desposition of epitaxial ternary transition metal carbide films", 2002, Thin Solid Films, vol. 405, pp. 122-128.*

(Continued)

*Primary Examiner* — Humera N Sheikh
*Assistant Examiner* — Seth Dumbris
(74) *Attorney, Agent, or Firm* — Sughrue Mion, PLLC

(57) ABSTRACT

Provided is a hard decorative member excellent in scratch resistance. The hard decorative member according to the present invention includes a base and a hard decorative coating film layered on the base, in which the hard decorative coating film includes a gray-tone layer including a compound formed by a reaction of an alloy of Ti and one or two or more metals M2 selected from Nb, Ta, and V with a non-metallic element including at least carbon. It is preferable that the amount of carbon contained in the gray-tone layer is 30 to 70 atm % in a total of Ti, the metal M2, and the non-metallic element of 100 atm %.

10 Claims, 8 Drawing Sheets

(51) Int. Cl.
*A44C 27/00* (2006.01)
*C23C 14/06* (2006.01)

(56) References Cited

U.S. PATENT DOCUMENTS

| | | | | |
|---|---|---|---|---|
| 5,409,762 | A * | 4/1995 | Ozaki | C23C 14/06 200/266 |
| 6,110,571 | A * | 8/2000 | Yaginuma | C23C 8/38 428/216 |
| 6,117,280 | A * | 9/2000 | Yaginuma | C23C 8/38 204/192.1 |
| 9,120,933 | B2 * | 9/2015 | Takazaki | C23C 14/0015 |
| 9,464,355 | B2 * | 10/2016 | Takazaki | C23C 14/0015 |
| 2002/0102400 | A1 | 8/2002 | Gorokhovsky et al. | |
| 2004/0093730 | A1 | 5/2004 | Miya et al. | |
| 2004/0208994 | A1 * | 10/2004 | Harkonen | C23C 16/32 427/249.1 |
| 2004/0231159 | A1 | 11/2004 | Shibuya et al. | |
| 2007/0275264 | A1 * | 11/2007 | Hultin | C23C 14/0015 428/687 |
| 2009/0087634 | A1 | 4/2009 | Naoi et al. | |
| 2009/0181262 | A1 * | 7/2009 | Isaksson | B44C 1/00 428/626 |
| 2009/0202312 | A1 | 8/2009 | Koike et al. | |
| 2010/0086756 | A1 * | 4/2010 | Miya | A44C 27/006 428/213 |
| 2013/0071620 | A1 | 3/2013 | Waki et al. | |
| 2015/0044508 | A1 | 2/2015 | Takazaki | |

FOREIGN PATENT DOCUMENTS

| | | | | |
|---|---|---|---|---|
| JP | H07173608 | * | 7/1995 | ............. C23C 14/06 |
| JP | 08-092685 A | | 4/1996 | |
| JP | 2000129463 | * | 5/2000 | ............. C23C 28/00 |
| JP | 2004-043959 A | | 2/2004 | |
| JP | 2007-262472 A | | 10/2007 | |
| JP | 2011-256424 A | | 12/2011 | |
| JP | 2013-194284 A | | 9/2013 | |
| WO | WO 91/17283 | * | 11/1991 | ............. C23C 14/34 |
| WO | 2009/104273 A1 | | 8/2009 | |
| WO | WO2009104273 | * | 8/2009 | ......... C23C 14/0635 |

OTHER PUBLICATIONS

"Duratect", Citizen Watch Co., Ltd., [searched on Feb. 5, 2013], the Internet (URL: http://citizen.jp/technology/duratect.html).

International Search Report of PCT/JP2014/057578 dated Jun. 10, 2014 [PCT/ISA/210].

Communication dated Oct. 19, 2016, from the State Intellectual Property Office of the P.R.C. in counterpart Chinese application No. 201480018691.6.

Communication dated Nov. 24, 2016 from the European Patent Office in counterpart European application No. 14774258.9.

* cited by examiner

[Fig. 1]
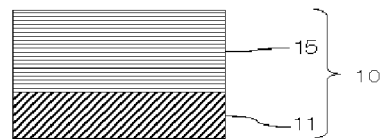
[Fig. 2]
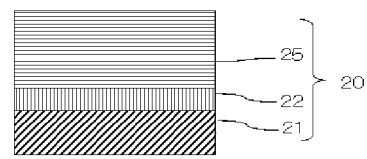
[Fig. 3]
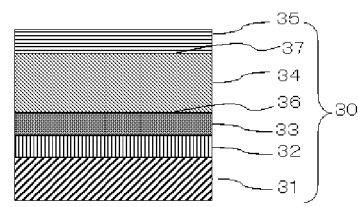
[Fig. 4]
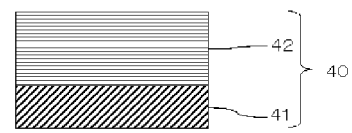

[Fig. 5]
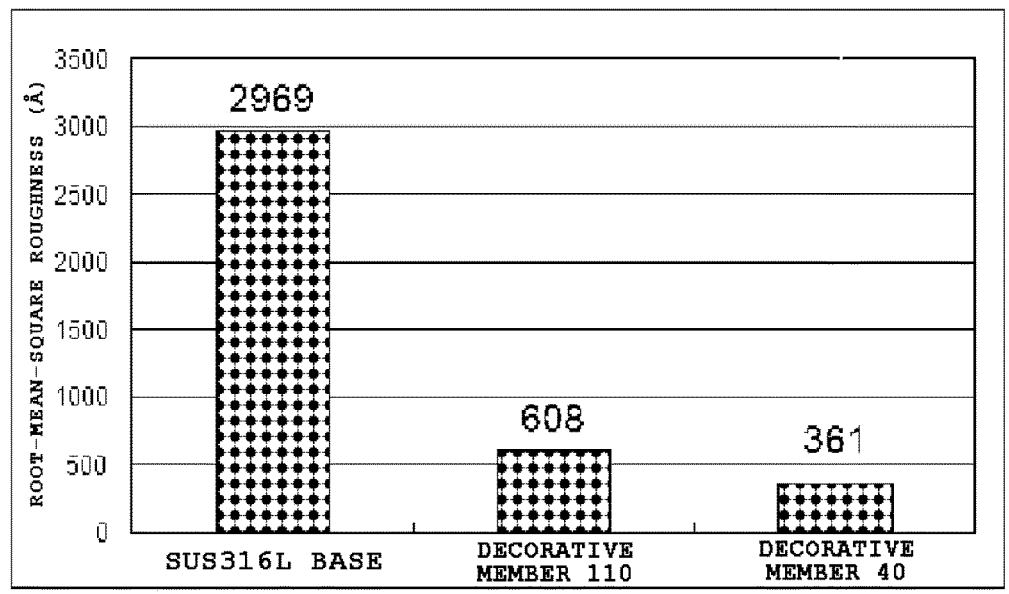
[Fig. 6]
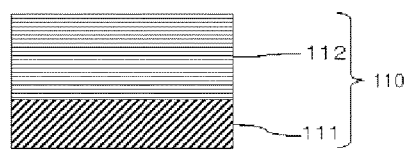
[Fig. 7]
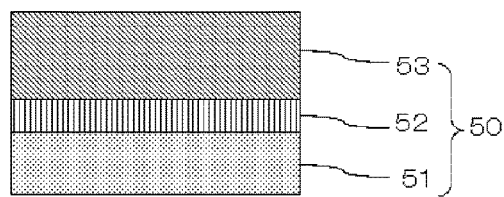

[Fig. 8]
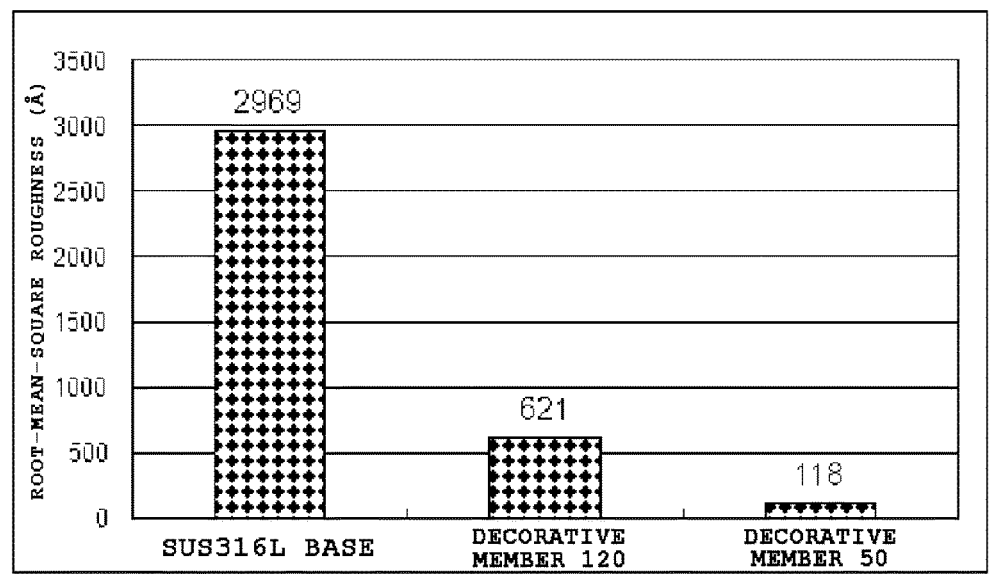
[Fig. 9]
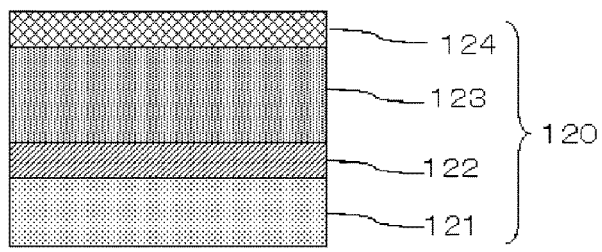

[Fig. 10]
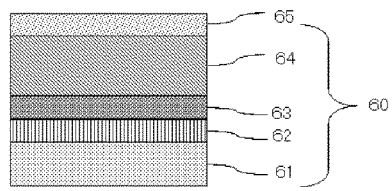
[Fig. 11]
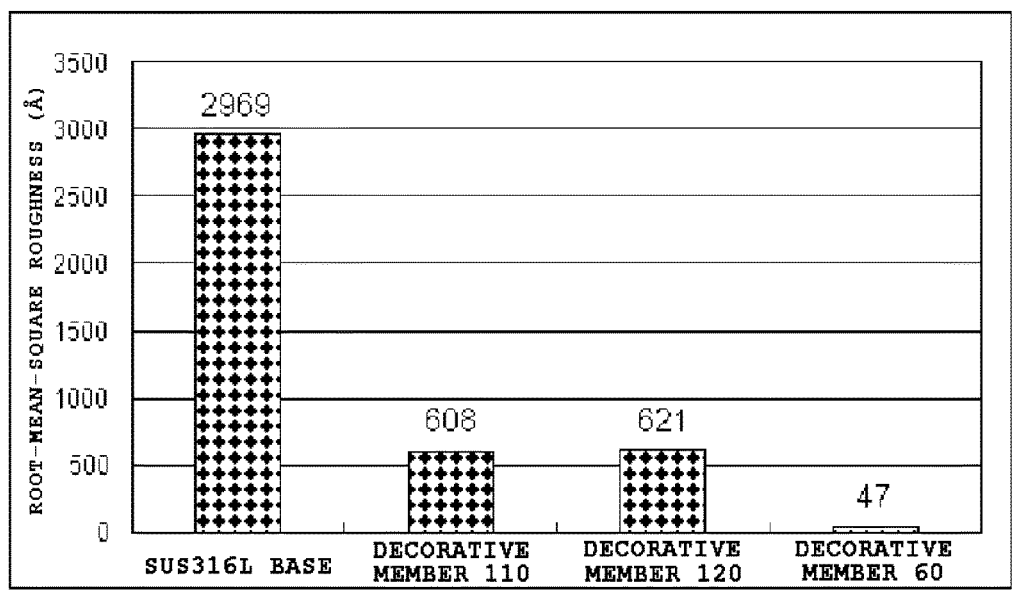
[Fig. 12]
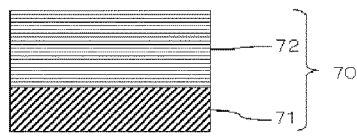

[Fig. 13]
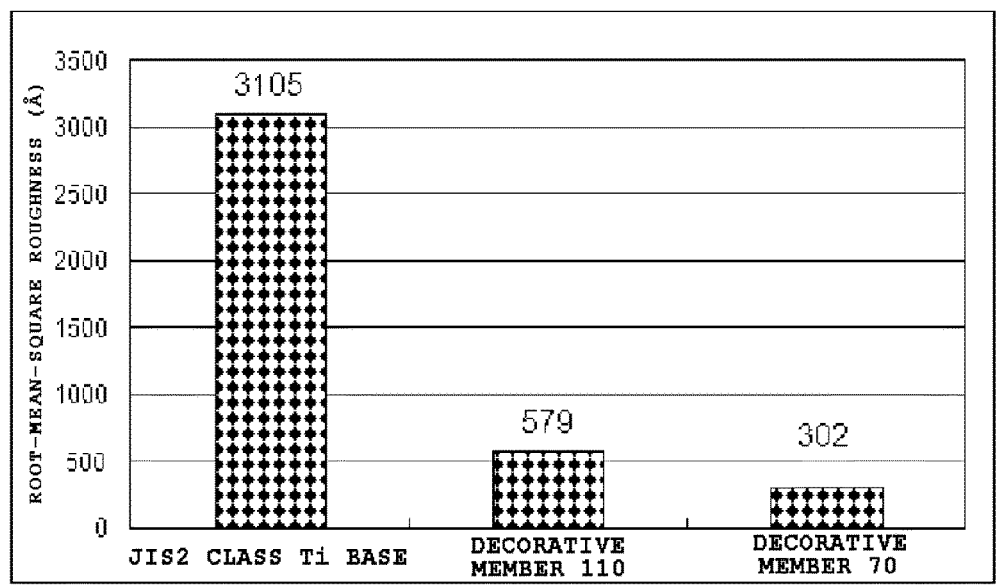
[Fig. 14]
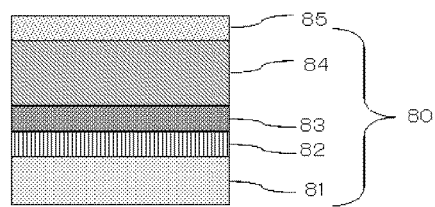

[Fig. 15]
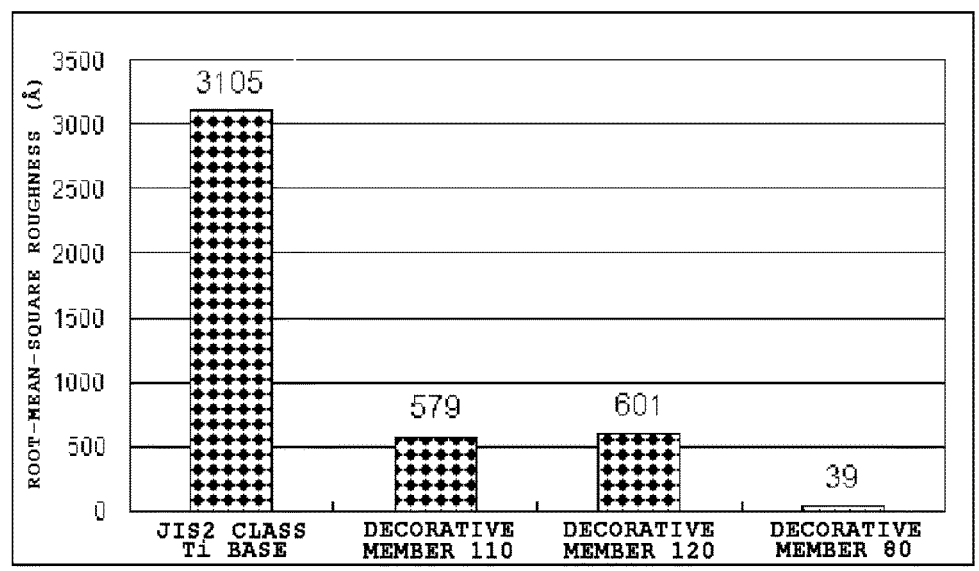
[Fig. 16]
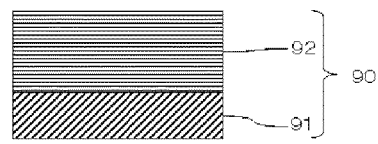

[Fig. 17]
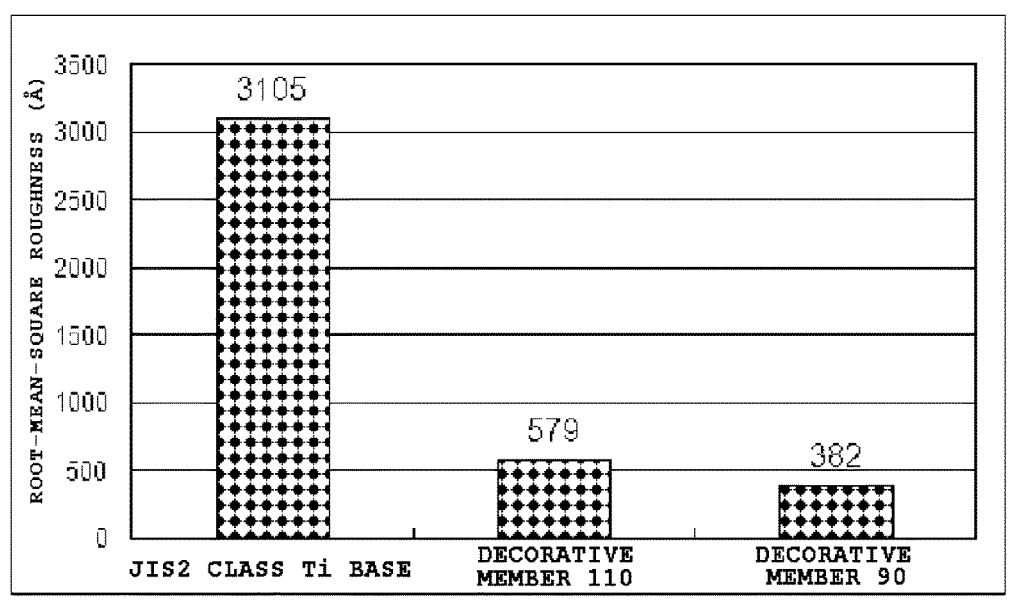
[Fig. 18]
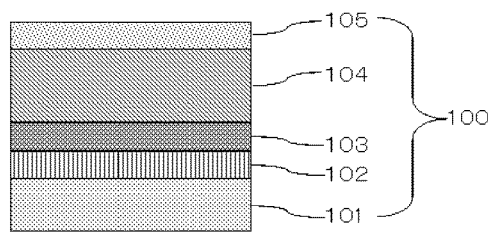

[Fig. 19]
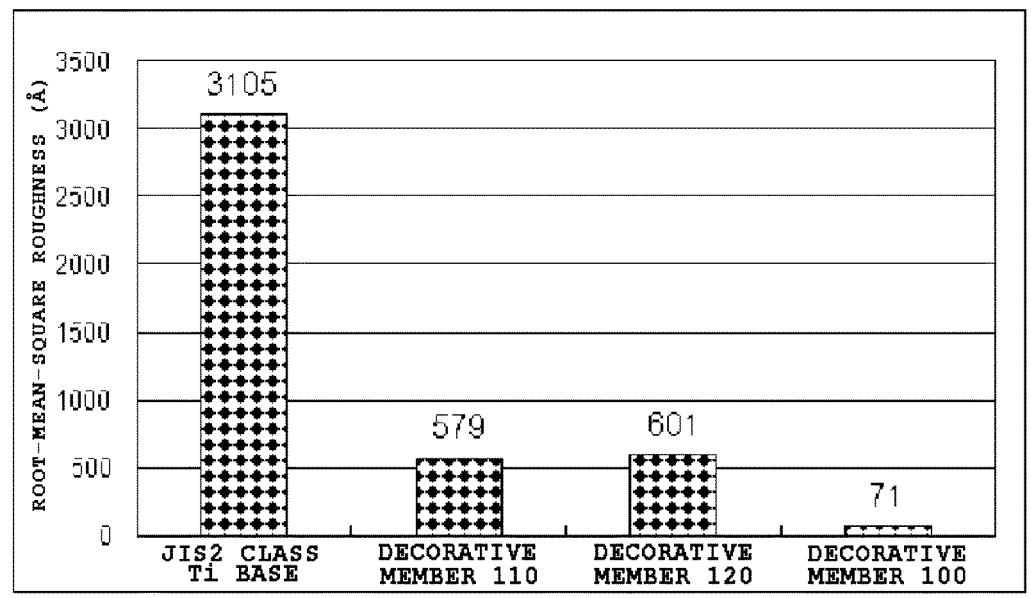

HARD DECORATIVE MEMBER HAVING GRAY-TONE LAYER

CROSS REFERENCE TO RELATED APPLICATIONS

This application is a National Stage of International Application No. PCT/JP2014/057578, filed Mar. 19, 2014, claiming priority based on Japanese Patent Application No. 2013-071561, filed Mar. 29, 2013, the contents of all of which are incorporated herein by reference in their entirety.

TECHNICAL FIELD

The present invention relates to a hard decorative member having a gray-tone layer.

BACKGROUND ART

Conventionally, coating films having high lightness have been formed on the outermost layers of exterior parts, ornaments such as glasses, accessories, and timepieces, decorative articles, sporting goods, and the like to make the high-quality appearances thereof. For example, Non Patent Literature 1 describes that a hard coating film comprising titanium carbide is formed on a base with stainless steel, titanium, or the like by a dry plating method, to produce a case or a band for a timepiece. Scratch resistance can also be improved by forming such a hard coating film.

CITATION LIST

Patent Literature

Patent Literature 1: Japanese Patent Laid-Open No. 2004-043959
Patent Literature 2: Japanese Patent Laid-Open No. 2007-262472

Non Patent Literature

Non Patent Literature 1: "DURATECT", CITIZEN WATCH CO., LTD., [searched on Feb. 5, 2013], the Internet (URL: http://citizen.jp/technology/duratect.html)

SUMMARY OF INVENTION

Technical Problem

However, the decorative member having a hard coating film comprising titanium carbide is susceptible to improvement in scratch resistance. Accordingly, an objective of the present invention is to provide a decorative member having a hard coating film excellent in scratch resistance.

Solution to Problem

The hard decorative member according to the present invention is a hard decorative member including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon.

Advantageous Effects of Invention

The hard decorative member according to the present invention is the decorative member which is excellent in corrosion resistance as well as scratch resistance, and which also provides for resistance to metal allergies.

BRIEF DESCRIPTION OF DRAWINGS

FIG. 1 is a view for illustrating an example of a hard decorative member.
FIG. 2 is a view for illustrating an example of a hard decorative member.
FIG. 3 is a view for illustrating an example of a hard decorative member.
FIG. 4 is a view for explaining a first example of the present invention.
FIG. 5 is a view for explaining the first example of the present invention.
FIG. 6 is a view for explaining a comparative example.
FIG. 7 is a view for explaining a second example of the present invention.
FIG. 8 is a view for explaining the second example of the present invention.
FIG. 9 is a view for explaining a comparative example.
FIG. 10 is a view for explaining a third example of the present invention.
FIG. 11 is a view for explaining the third example of the present invention.
FIG. 12 is a view for explaining a fourth example of the present invention.
FIG. 13 is a view for explaining the fourth example of the present invention.
FIG. 14 is a view for explaining a fifth example of the present invention.
FIG. 15 is a view for explaining the fifth example of the present invention.
FIG. 16 is a view for explaining a sixth example of the present invention.
FIG. 17 is a view for explaining the sixth example of the present invention.
FIG. 18 is a view for explaining a seventh example of the present invention.
FIG. 19 is a view for explaining the seventh example of the present invention.

DESCRIPTION OF EMBODIMENTS

The present invention will be specifically explained below.
<Hard Decorative Member>
A hard decorative member according to the present invention includes abase and a hard decorative coating film layered on the base, wherein the hard decorative coating film includes a gray-tone layer.
[Base]
The base used in the present invention is a base formed of a metal, ceramic, or plastic. Specific examples of metals (including alloys) include stainless steel, titanium, titanium alloy, copper, copper alloy, tungsten; stainless steel, titanium, and titanium alloy subjected to hardening treatment; and the like. These metals may be used singly or in combination of two or more kinds thereof. The shape of the above-described base is not limited.
[Gray-Tone Layer]
The gray-tone layer used in the present invention includes a compound formed by a reaction of an alloy of Ti and one or two or more metals M2 selected from Nb, Ta, and V with a non-metallic element including at least carbon. Examples of the non-metallic element include oxygen and nitrogen as well as carbon, and therefore, examples of the reaction compound include carbides, carbonitrides, oxycarbides, or oxynitrocarbides of the alloy. In the present invention, Ti and the metal M2 have solid solution conditions, and it is therefore considered that Ti and the metal M2 exhibit a compound of a metal alloy in the region of the solid solution conditions or exhibit the composite form of a solid solution metal and a monometal in the other region. The reaction compound of the present specification also includes the composite form. Specifically, the exhibition of the compound of the alloy can also be confirmed based on X-ray diffraction measurement results. Because the diffraction peak of the compound shifts due to the alloy ratio between Ti and the metal M2, the formed compound of Ti and the metal M2 can be confirmed to be a compound of an alloy depending on a corresponding ratio.

The reaction compound results in the gray-tone layer which has high hardness and is excellent in scratch resistance and corrosion resistance because of including a combination of Ti and one or two or more metals M2 selected from Nb, Ta, and V, such as Ti—Nb, Ti—Ta, Ti—V, Ti—Nb—Ta, Ti—Nb—V, Ti—Ta—V, or Ti—Nb—Ta—V. The combination of Ti—Nb is preferable from the viewpoint of a deep gray tone in a wider range and of high hardness, the combination of Ti—Ta is preferable from the viewpoint of higher corrosion resistance, and the combination of Ti—Nb—Ta is preferable from the viewpoint of higher corrosion resistance, higher film hardness, and a deep gray tone in a wide range.

The amount of Ti is preferably 20 to 90 mass %, more preferably 30 to 90 mass %, and the amount of the metal M2 is preferably 10 to 80 mass %, more preferably 10 to 70 mass %, assuming that the total of Ti and the metal M2 is 100 mass %, in the entire gray-tone layer, i.e., in the total amount of the reaction compound included in the gray-tone layer. When plural metals M2 are used, the amount of the metals M2 is the total amount of the plural metals M2. The amounts of Ti and the metal M2 in the above-described ranges result in a deeper gray tone and higher hardness. The amounts of the metals in the reaction compound can be determined by ESCA (X-ray photoelectron spectroscopy) or EPMA (electron probe microanalyzer).

In the entire gray-tone layer, i.e., in the total amount of the reaction compound included in the gray-tone layer, metals M3 such as Cr, B, Al, Si, Mn, Co, La, Ce, Y, and Sc, other than the above-described metals, may also be contained in a total amount of more than 0 mass % and 5 mass % or less based on 100 mass % in total of Ti and the metal M2. It is preferable to add Cr from the viewpoint of improvement in corrosion resistance. However, a case in which no metal M3 is contained and only Ti and the metal M2 are contained results in the wider range of conditions for obtaining a deep gray-tone layer, and is preferable.

The kinds and amounts of the metal atoms in the reaction compound are considered to be identical to the kinds and amounts of metal atoms in a raw material alloy for generating the reaction compound.

In the reaction compound, use of only carbon as a non-metallic element is preferable because of resulting in a deeper gray tone. The combination of carbon with nitrogen is preferable for controlling hardness to a high level, and the combination of carbon with oxygen is also preferable for improving adhesiveness with the base or for intending to obtain a darker gray tone.

In the entire gray-tone layer, i.e., in the total amount of the reaction compound included in the gray-tone layer, the amount of the non-metallic element is preferably 30 to 70 atm %, more preferably 40 to 70 atm %, and the total amount of Ti and the metal M2 is preferably 30 to 70 atm %, more preferably 30 to 60 atm % (assuming that the total amount of the non-metallic element, Ti, and the metal M2 is 100 atm %). In the case of using only carbon as the non-metallic element, the amount of the non-metallic element is the amount of carbon. In the case of using nitrogen or oxygen with carbon as the non-metallic elements, the amount of the non-metallic elements is the total amount of the non-metallic elements. In addition, when carbon, and nitrogen or oxygen are used as the non-metallic elements, the amount of carbon is preferably 30 to 70 atm %, more preferably 40 to 70 atm %, the amount of nitrogen and oxygen is preferably 0 to 20 atm %, more preferably 0 to 10 atm %, and the total amount of Ti and the metal M2 is preferably 30 to 70 atm %, more preferably 30 to 60 atm %. The amounts of the non-metallic elements, Ti, and the metal M2 in the above-described ranges can result in higher hardness in the case of nitrogen, or in improvement in adhesiveness or a darker gray tone in the case of oxygen. The amounts of the non-metallic elements and the metals in the reaction compound can be determined by ESCA (X-ray photoelectron spectroscopy) or EPMA (electron probe microanalyzer).

In the gray-tone layer, the amount of the non-metallic element may be increased with increasing a distance from the base while the total amount of Ti and the metal M2 may be decreased with increasing a distance from the base. As used herein, such a gray-tone layer also refers to as a gray-tone gradient layer. The amount of the non-metallic element may be increased and the total amount of Ti and the metal M2 may be decreased in a continuous manner such as a linear or curved manner, or in a discontinuous and intermittent manner such as a stepwise manner. This results in an advantage that stress strain generated between the gray-tone layer and a layer therebeneath or the base can be relieved, and therefore, the degree of adhesion with the base is enhanced to inhibit generation of a crack and peeling, and further contributes to the effect of making a scratch less noticeable if the scratch is made.

In the case of the gray-tone gradient layer, the amount of the non-metallic element is preferably 0 to 30 atm %, and the total amount of Ti and the metal M2 is preferably 70 to 100 atm %, in a surface, closer to the base, in the gray-tone gradient layer. In addition, the amount of the non-metallic element is preferably 30 to 70 atm %, and the total amount of Ti and the metal M2 is preferably 30 to 70 atm % (assuming that the total amount of the non-metallic element, Ti, and the metal M2 is 100 atm %) in a surface, reverse to the surface closer to the base, in the gray-tone gradient layer. In this case, the degree of adhesion with the base is improved and high scratch resistance is obtained.

The amounts of the non-metallic element and the metals in the thickness direction of the film can be determined by ESCA (X-ray photoelectron spectroscopy) or EPMA (electron probe microanalyzer). "Amount of each element in surface" in the gray-tone gradient layer typically means the amount of each element in a region from the surface of the layer to 10 nm in a thickness direction (depth direction).

The thickness of the gray-tone layer is preferably 0.2 μm or more, more preferably 0.2 to 4.0 μm. The thickness of the gray-tone layer in the above-described range results in a deeper gray tone and in high hardness and scratch resistance. Such a thickness of 0.2 μm or more also results in an advantage that the influence of the color of a layer formed beneath the gray-tone layer is inhibited.

The film hardness of the gray-tone layer is preferably HV1000 or more, more preferably HV1500 or more, from the viewpoint of scratch resistance. The upper limit of the hardness of the gray-tone layer is not particularly limited but is, for example, HV3000.

In the gray-tone layer, it is preferable that the difference between a maximum value and a minimum value is 10% or less (0% or more and 10% or less) in measurement of a reflectance in the visible region (360 to 740 nm), and $L^*$ is more than 60 and 73 or less, each of $a^*$ and $b^*$ is −2.0 to 2.0, and the difference between $a^*$ and $b^*$ ($|a^*-b^*|$) is 1.5 or less (0 or more and 1.5 or less) in Lab color space display. It may be considered that a deeper gray-tone is achieved when the maximum and minimum values of the above-described reflectance, $L^*$, $a^*$, and $b^*$ satisfy the above-described conditions. Because a conventional decorative member having a hard coating film comprising titanium carbide has had a tone having a gray with a yellow tint or a dark gray tone, almost black, the decorative member having scratch resistance maintained to a high level and having a deep gray tone has been desired. The gray-tone layer of the present invention can satisfy such a demand. In particular, when only carbon is used as a non-metallic element, and the amount of carbon is 30 to 70 atm % in a reaction compound, the maximum and minimum values of the above-described reflectance, $L^*$, $a^*$, and $b^*$ can satisfy the above-described requirements.

As used herein, the film hardness of a gray-tone layer, the maximum and minimum values of a reflectance, $L^*$, $a^*$, and $b^*$ refer to values measured for the gray-tone layer formed on a base (for example, SUS316L material).

[Adhesion Layer]

The hard decorative member of the present invention may further include an adhesion layer as the above-described hard decorative coating film. The adhesion layer is layered between the base and the gray-tone layer. Scratch resistance performance is determined nearly by the product of the thickness of the coating film, the degree of the adhesion of the coating film, and the hardness of the coating film. The disposition of the adhesion layer causes the degree of adhesion between the base and a layer formed on the adhesion layer to be enhanced, also enables the thick coating film to be formed, and can therefore result in contribution to improvement in the scratch resistance of the hard decorative member.

Examples of the above-described adhesion layer include a Si coating film, a Ti coating film, an Al coating film, a Mg coating film, an alloy coating film of Ti and one or two or more metals M2 selected from Nb, Ta, and V, and a lower oxide film of an alloy of Ti and one or two or more metals M2 selected from Nb, Ta, and V, which are selected depending on compatibility with a base material and on an environment in which such a coating film is used. When the lower oxide film is used, the degree of adhesion between the base and a layer formed on the adhesion layer can be enhanced by a crosslinking effect due to the two hands of oxygen. The adhesion layer containing metals identical to metals included in the layer formed on the adhesion layer is preferable in view of the high degree of adhesion and easy production thereof.

When the adhesion layer is the alloy coating film of Ti and the metal M2 or the lower oxide film of the alloy of Ti and the metal M2, the amount of Ti is preferably 20 to 90 mass %, more preferably 30 to 90 mass %, and the amount of the metal M2 is preferably 10 to 80 mass %, more preferably 10 to 70 mass %, assuming that the total of Ti and the metal M2 is 100 mass %. When plural metals M2 are used, the amount of the metals M2 is the total amount of the plural metals M2. The amounts of the metals in the reaction compound can be determined by ESCA (X-ray photoelectron spectroscopy) or EPMA (electron probe microanalyzer).

The above-described adhesion layer may contain metals M3 such as Cr, B, Al, Si, Mn, Co, La, Ce, Y, and Sc which are other than the above-described metals in a total amount of more than 0 mass % and 5 mass % or less based on 100 mass % of the above-described metals (i.e., Ti in the case of a Ti coating film; or the total of Ti and the metal M2 in the case of the alloy coating film of Ti and the metal M2 or the lower oxide film of the alloy of Ti and the metal M2). It is preferable to add Cr from the viewpoint of improvement in corrosion resistance.

The above-described lower oxide film of the alloy may contain slight amounts of nitrogen and carbon.

The content of oxygen in the above-described lower oxide film of the alloy is preferably 5 to 60 atm %, more preferably 5 to 45 atm %, and the total amount of Ti and the metal M2 is preferably 40 to 95 atm %, more preferably 55 to 95 atm % (assuming that the total amount of oxygen, Ti, and the metal M2 is 100 atm %). An oxygen content of less than 5 atm % results in almost no difference in adhesiveness from an alloy metal film, whereas an oxygen content of more than 60 atm % may result in deterioration in adhesiveness and may also result in deterioration in scratch resistance. The amounts of the non-metallic element and the metal in the reaction compound can be determined by ESCA (X-ray photoelectron spectroscopy) or EPMA (electron probe microanalyzer).

The thickness of the adhesion layer is 0.03 to 0.3 μm. A thickness of 0.03 μm or more results in the effect of improving adhesiveness, whereas a thickness of more than 0.3 μm often results in no change of the effect of improving adhesiveness.

[Hardening Layer]

The hard decorative member of the present invention may further include a hardening layer as the hard decorative coating film. The hardening layer is layered between the base and the gray-tone layer, and the hardness of the hardening layer is higher than that of the gray-tone layer. Scratch resistance performance is determined nearly by the product of the thickness of the coating film, the degree of the adhesion of the coating film, and the hardness of the coating film. The disposition of the hardening layer causes hardness of the entire coating film to be enhanced, also enables the thick coating film to be formed, and can therefore result in contribution to improvement in the scratch resistance of the hard decorative member.

The above-described hardening layer is not particularly limited if having higher hardness than the gray-tone layer, and specific examples thereof include a layer that has higher hardness than the gray-tone layer (typically, hardness which is higher than that of the gray-tone layer and HV2000 or more), and comprises a compound formed by a reaction of an alloy of Ti and one or two or more metals M2 selected from Nb, Ta and V with one or two non-metallic elements selected from carbon and nitrogen. The layer is selected depending on an appearance color and an environment in which a coating film is used. The hardening layer containing metals identical to metals included in a layer formed on the hardening layer is preferable in view of the high degree of adhesion and easy production thereof.

In the reaction compound, a combination of Ti and one or two or more metals M2 selected from Nb, Ta, and V, such as Ti—Nb, Ti—Ta, Ti—V, Ti—Nb—Ta, Ti—Nb—V, Ti—Ta—V, or Ti—Nb—Ta—V, is formed, and therefore, high hardness is obtained In the reaction compound, the amount of Ti is preferably 20 to 90 mass %, more preferably 30 to 90 mass %, and the amount of the metal M2 is preferably 10 to 80 mass %, more preferably 10 to 70 mass %, assuming that the total of Ti and the metal M2 is 100 mass %. When plural metals M2 are used, the amount of the metals M2 is the total amount of the plural metals M2. The amounts of Ti and the metal M2 in the above-described ranges result in higher hardness and a deeper gray tone. The amounts of the metals in the reaction compound can be determined by ESCA (X-ray photoelectron spectroscopy) or EPMA (electron probe microanalyzer).

The above-described hardening layer may contain metals M3 such as Cr, B, Al, Si, Mn, Co, La, Ce, Y, and Sc which are other than the above-described metals in a total amount of more than 0 mass % and 5 mass % or less based on 100 mass % of the total of Ti and the metal M2. It is preferable to add Cr from the viewpoint of improvement in corrosion resistance.

The kinds and amounts of the metal atoms in the reaction compound are considered to be identical to the kinds and amounts of metal atoms in a raw material alloy for generating the reaction compound.

Use of carbon and nitrogen as non-metallic elements in the reaction compound is preferable because of enabling hardness to be controlled to a high level.

In the hardening layer, i.e., in the reaction compound, the amount of the non-metallic element is preferably 10 to 70 atm %, more preferably 20 to 60 atm %, and the total amount of Ti and the metal M2 is preferably 30 to 90 atm %, more preferably 40 to 80 atm % (assuming that the total amount of the non-metallic element, Ti, and the metal M2 is 100 atm %). The amount of the non-metallic element is the amount of carbon or nitrogen in the case of using only carbon or nitrogen as a non-metallic element and is, in the case of using carbon and nitrogen as non-metallic elements, the amount of the total of the non-metallic elements. In addition, in the case of using carbon and nitrogen as the non-metallic elements, the amount of carbon is preferably 10 to 70 atm %, more preferably 20 to 70 atm %, the amount of nitrogen is preferably 0 to 20 atm %, more preferably 0 to 10 atm %, and the total amount of Ti and the metal M2 is preferably 30 to 90 atm %, more preferably 30 to 80 atm %. The amounts of the non-metallic element, Ti, and the metal M2 in the above-described ranges result in higher hardness. The amounts of the non-metallic element and the metals in the reaction compound can be determined by ESCA (X-ray photoelectron spectroscopy) or EPMA (electron probe microanalyzer).

The thickness of the hardening layer is preferably 0.4 to 4.0 µm. A thickness of less than 0.4 µm may result in insufficient hardness. Although it is desirable to maximize the film thickness from the viewpoint of scratch resistance, a thickness of more than 4.0 µm may result in the increased risk of generation of a crack or peeling due to a rise in film stress, and may also result in a disadvantage in view of a cost.

It is essential only that the film hardness of the hardening layer is higher than that of the gray-tone layer. From the viewpoint of scratch resistance, the hardness HV thereof is preferably 2000 or more. The upper limit of the film hardness of the hardening layer is not particularly limited but is, for example, HV3000. When the hardening layer is disposed together with the gray-tone layer, the film hardness of the hardening layer is designed to be higher than the film hardness of the gray-tone layer. The film hardness of the hardening layer can be adjusted to be higher than that of the gray-tone layer by, for example, appropriately changing the kinds and percentages of non-metallic element, Ti, and metal M2 forming the hardening layer in the preferred ranges mentioned above. As used herein, the film hardness of the hardening layer or the film hardness of the gray-tone layer refers to a value measured for the hardening layer or the gray-tone layer formed on a base (for example, SUS316L material).

[Gradient Adhesion Layer]

The hard decorative member of the present invention may further include a gradient adhesion layer as the above-described hard decorative coating film. The gradient adhesion layer is layered between the base and the gray-tone layer. Scratch resistance performance is determined nearly by the product of the thickness of the coating film, the degree of the adhesion of the coating film, and the hardness of the coating film. The disposition of the gradient adhesion layer enables stress strain generated between the gradient adhesion layer and the base to be relieved, causes the degree of adhesion with the base to be enhanced to inhibit the generation of a crack and peeling, and can therefore result in contribution to improvement in the scratch resistance of the hard decorative member.

The above-described gradient adhesion layer comprises a compound formed by a reaction of an alloy of Ti and one or two or more metals M2 selected from Nb, Ta, and V with one or two non-metallic elements selected from carbon and nitrogen, and the amount of the non-metallic element in the gradient adhesion layer is increased with increasing a distance from the base. It is preferable to further use, as a non-metallic element, oxygen as well as carbon or nitrogen. The gradient adhesion layer containing metals identical to metals included in a layer formed on the gradient adhesion layer is preferable in view of the high degree of adhesion and easy production thereof.

In the reaction compound, a combination of Ti and one or two or more metals M2 selected from Nb, Ta, and V, such as Ti—Nb, Ti—Ta, Ti—V, Ti—Nb—Ta, Ti—Nb—V, Ti—Ta—V, or Ti—Nb—Ta—V, is formed, and therefore, high hardness and the high degree of adhesion are obtained.

In the entire gradient adhesion layer, i.e., in the total amount of the reaction compound included in the gradient adhesion layer, the amount of Ti is preferably 20 to 90 mass %, more preferably 30 to 90 mass %, the amount of the metal M2 is preferably 10 to 80 mass %, more preferably 10 to 70 mass %, assuming that the total of Ti and the metal M2 is 100 mass %. When plural metals M2 are used, the amount of the metals M2 is the total amount of the plural metals M2. The amounts of the metals in the reaction compound can be determined by ESCA (X-ray photoelectron spectroscopy) or EPMA (electron probe microanalyzer).

In the entire gradient adhesion layer, i.e., in the total amount of the reaction compound included in the gradient adhesion layer, metals M3 such as Cr, B, Al, Si, Mn, Co, La, Ce, Y, and Sc which are other than the above-described metals may be contained in a total amount of more than 0 mass % and 5 mass % or less based on 100 mass % of the total of Ti and the metal M2. It is preferable to add Cr from the viewpoint of improvement in corrosion resistance.

The kinds and amounts of the metal atoms in the reaction compound are considered to be identical to the kinds and amounts of the metal atoms in a raw material alloy for generating the reaction compound.

In the entire gradient adhesion layer, i.e., in the total amount of the reaction compound included in the gradient adhesion layer, the amount of the non-metallic element is preferably more than 0 atm % and 70 atm % or less, and is adjusted by the amount of the non-metallic element introduced into the hardening layer. It is desirable that the total amount of Ti and the metal M2 is preferably 30 atm % or more and less than 100 atm %, depending on the amount of the non-metallic element introduced into the hardening layer (assuming that the total amount of the non-metallic element, Ti, and the metal M2 is 100 atm %). In the case of using only carbon or nitrogen as the non-metallic element, the amount of the non-metallic element is the amount of carbon or nitrogen. In the case of using carbon or nitrogen, and oxygen as the non-metallic elements, the amount of the non-metallic elements is the total amount of these non-metallic elements. In addition, when carbon and nitrogen are used as the non-metallic elements, the amount of carbon is preferably more than 0 atm % and 60 atm % or less, the amount of nitrogen is preferably more than 0 atm % and 10 atm % or less, and the total amount of Ti and the metal M2 is preferably 30 atm % or more and less than 100 atm %. The amounts of the non-metallic element, Ti and the metal M2 in the above-described ranges results in the higher degree of adhesion. The amounts of the non-metallic elements and the metals in the reaction compound can be determined by ESCA (X-ray photoelectron spectroscopy) or EPMA (electron probe microanalyzer).

In the gradient adhesion layer, the amount of the non-metallic element is increased with increasing a distance from the base while the total amount of Ti and the metal M2 is decreased with increasing a distance from the base. The amount of the non-metallic element may be increased and the total amount of Ti and the metal M2 may be decreased in a continuous manner such as a linear or curved manner, or in a discontinuous and intermittent manner such as a stepwise manner.

In a surface, closer to the base, in the gradient adhesion layer, the amount of the non-metallic element is preferably more than 0 atm % and 30 atm % or less, and the total amount of Ti and the metal M2 is preferably 70 atm % or more and less than 100 atm %. In a surface, reverse to the surface closer to the base, in the gradient adhesion layer, the amount of the non-metallic element is preferably 30 to 70 atm %, and the total amount of Ti and the metal M2 is preferably 70 to 30 atm % (assuming that the total amount of the non-metallic element, Ti, and the metal M2 is 100 atm %). This case enables strain due to film stress to be further controlled, and can therefore result in contribution to improvement in the scratch resistance of the hard decorative member.

The amounts of the non-metallic element and the metal in the thickness direction of the film can be determined by ESCA (X-ray photoelectron spectroscopy) or EPMA (electron probe microanalyzer). "Amount of each element in surface" in the gradient adhesion layer typically means the amount of each element in a region from the surface of the layer to 10 nm in a thickness direction (depth direction).

In the case of 0.05 µm or more, an effect for a stress relief layer is provided. Although the effect for the stress relief layer is not changed even when the stress relief layer is formed to have a thickness of 0.5 µm or more, the formation is disadvantageous in view of a cost in production. Therefore, the thickness of the gradient adhesion layer is preferably 0.05 to 0.5 µm.

[Antifouling Coating Layer]

In the hard decorative member of the present invention, an antifouling coating layer for preventing fouling may be further layered on the above-described hard decorative coating film.

The antifouling coating layer is formed by applying a coating agent having a fluorine-modified group and a reactive functional group onto the decorative member, and the outermost surface of the decorative member is terminated with a fluorine group (CF3, CF2, or CF). As a result, the surface free energy of the surface of the decorative member is decreased, adhesion of a fingerprint and fouling is inhibited, and adhering fouling is easily wiped off.

The thickness of the antifouling coat layer is preferably 0.003 to 0.05 µm. When the thickness is 0.003 µm or less, the antifouling coating layer is too thin, and immediately worn and removed. When the thickness is 0.05 µm or more, a gray tone is deteriorated by an interference effect due to the transparent fluorine coat agent.

[Embodiments of Hard Decorative Member]

Examples of the hard decorative member of the present invention include embodiments, such as base/gray-tone layer (Embodiment A), base/adhesion layer/gray-tone layer (Embodiment B), base/hardening layer/gray-tone layer (Embodiment C), base/gradient adhesion layer/gray-tone layer (Embodiment D), base/adhesion layer/hardening layer/gray-tone layer (Embodiment E), base/adhesion layer/gradient adhesion layer/gray-tone layer (Embodiment F), base/gradient adhesion layer/hardening layer/gray-tone layer (Embodiment G), and base/adhesion layer/gradient adhesion layer/hardening layer/gray-tone layer (Embodiment H), each having a hard decorative coating film in which the above-mentioned layers are sequentially layered on the base.

Specifically, FIG. 1 illustrates a hard decorative member 10 of Embodiment A, in which a gray-tone layer 15 is layered as a hard decorative coating film on a base 11. FIG. 2 illustrates a hard decorative member 20 of Embodiment B, in which an adhesion layer 22 and a gray-tone layer 25 are layered as a hard decorative coating film on a base 21.

A hard decorative member of Embodiment H further includes, as a hard decorative coating film, an adhesion layer, a gradient adhesion layer, and a hardening layer as well as a gray-tone layer. In other words, the adhesion layer 32, the gradient adhesion layer 33, the hardening layer 34, and the gray-tone layer 35 are layered in this order on a base 31 in the hard decorative member 30 as illustrated in FIG. 3. The details (such as the kinds and percentages of constituent elements, thicknesses, and hardness) of the adhesion layer, the gradient adhesion layer, the hardening layer, and the gray-tone layer are mentioned above, and the relationships of the amounts of non-metallic elements in the gradient adhesion layer, the hardening layer, and the gray-tone layer are described below.

It is preferable that the amount (atm %) of the non-metallic element in the hardening layer is equal to or more than the total amount (atm %) of carbon and nitrogen in a surface 36, closer to the hardening layer, in the gradient adhesion layer. This case enables the hardness of the hardening layer to be more improved, and can therefore result in contribution to improvement in the scratch resistance of the hard decorative member. It is preferable to adjust the amount of the non-metallic element in the hardening layer to the amount of the non-metallic element showing the maximum hardness from the viewpoint of film hardness and scratch resistance.

It is preferable that the amount (atm %) of the non-metallic element in a surface 37, closer to the hardening layer, in the gray-tone layer is equal to or more than the amount (atm %) of the non-metallic element in the hardening layer depending on the demanded degrees of lightness and a color tone. This case results in a mild change in the color tone and gives the effect of making a scratch less noticeable if the scratch is made. Specifically, the amount of the non-metallic element in the surface, closer to the hardening layer, in the gray-tone layer is preferably 0 to 40 atm % more than the amount of the non-metallic element in the hardening layer, and more preferably equal to the amount of the non-metallic element in the hardening layer, from the viewpoint of a deep gray-tone.

Such Embodiment H is particularly excellent in scratch resistance, and is preferable.

Furthermore, examples of the hard decorative member of the present invention also include Embodiment I in which an antifouling coating layer is further layered on the hard decorative coating film in each of Embodiments A to H.

In any embodiment, the above-mentioned hard decorative member typically has a film hardness of HV1500 or more, preferably HV1500 to 3000, and is excellent in scratch resistance.

In any embodiment, in the above-mentioned hard decorative member, particularly, when the thickness of the gray-tone layer is 0.2 μm or more, only carbon is used as a non-metallic element in the gray-tone layer, and the amount thereof is 30 to 70 atm %, the difference between a maximum value and a minimum value is 10% or less (0% or more and 10% or less) in the visible region (360 to 740 nm) in measurement of a reflectance, and $L^*$ is more than 60 and 73 or less, each of $a^*$ and $b^*$ is −2.0 to 2.0, and the difference between $a^*$ and $b^*$ ($|a^*-b^*|$) is 1.5 or less (0 or more and 1.5 or less) in Lab color space display. It may be considered that a deeper gray-tone is achieved when the maximum and minimum values of the above-described reflectance, $L^*$, $a^*$, and $b^*$ satisfy the above-described conditions. Because a conventional decorative member having a hard coating film comprising titanium carbide has had a tone having a gray with a yellow tint or a dark gray tone, almost black, the decorative member having scratch resistance maintained to a high level and having a deep gray tone has been desired. The hard decorative member of the present invention can satisfy such a demand.

<Method for Producing Hard Decorative Member>

A method for producing a hard decorative member of the present invention is a method for producing the hard decorative member mentioned above, in other words, a method for producing a hard decorative member including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon; and the method includes a gray-tone layer layering step of layering the gray-tone layer on the base using an alloy target of Ti and one or two or more metals M2 selected from Nb, Ta, and V by a reactive sputtering method.

The sputtering method is a method in which a high direct or alternating voltage is applied between a base and a target comprising the constituent atoms of a coating film while introducing an inert gas into a chamber evacuated to a vacuum, to collide ionized Ar with the target and to form a sputtered target substance on the base. In the reactive sputtering method, a slight amount of reactant gas can be introduced together with the inert gas, to form, on the base, a coating film of a compound formed by a reaction of the atoms included in the target with non-metallic elements included in the reactant gas. The kinds and percentages of the atoms included in the target are considered to be maintained even in the reaction compound.

In the gray-tone layer layering step, the target (raw material metal) is preferably an alloy in which Ti, a metal M2, and a metal M3 used as needed are combined, more specifically a sintered body of the alloy of the above-described metals. In the above-described sintered body, the kinds and percentages of Ti, the metal M2, and the metal M3 used as needed are the same as those explained for the gray-tone layer mentioned above.

Examples of the reactant gas include carbon atom-containing gases (gases containing no oxygen atom) such as methane gas and acetylene gas; nitrogen atom-containing gases such as nitrogen gas and ammonia; and oxygen atom-containing gases such as oxygen gas and carbon dioxide. Examples of the inert gas include Ar gas, Kr gas, and Xe gas.

In the gray-tone layer layering step, for example, under the condition of the inert gas at 100 to 200 sccm, only a carbon atom-containing gas is introduced at 30 to 200 sccm, preferably 30 to 150 sccm, to form a carbide film, or a reactant gas in which a carbon atom-containing gas is mixed with a nitrogen atom-containing gas or an oxygen atom-containing gas is introduced at 30 to 200 sccm, preferably 30 to 150 sccm, to form a carbonitride film, an oxycarbide film, or an oxynitrocarbide film, although the conditions of the step vary depending on a production apparatus and the composition of a target used. When the gas amount is in the above-described range, the amount of the non-metallic element in the reaction compound can be adjusted into the range explained for the gray-tone layer mentioned above.

The gray-tone gradient layer in which the amount of the non-metallic element is increased with increasing a distance from the base and the total amount of Ti and the metal M2 is decreased with increasing a distance from the base can be formed by performing the gray-tone layer layering step while increasing the amount of the reactant gas (for example, increasing the amount in a range of from 30 sccm to not more than 200 sccm).

The gas amount can be adjusted by a mass flow controller which is automatically controlled.

In the reactive sputtering method, the controllability of film quality and a film thickness is high, and automation is also easy. In addition, because the energy of a sputtered atom is high, heating of a base for improving adhesiveness is unnecessary, and a film can be formed even on the base such as a plastic base having a low melting point. In addition, because the method is a method in which a sputtered target substance is formed on a base, a film even with a high-melting point material can be formed, and material selection is free.

Furthermore, it is possible to easily form a carbide film, a carbonitride film, an oxycarbide film, an oxynitrocarbide film, or the like depending on selecting or mixing of the reactant gas as mentioned above. A carbide film, a carbonitride film, an oxycarbide film, an oxynitrocarbide film, or the like of an alloy can also be formed by alloying the atoms included in the target. Adhesiveness, film hardness, and a color tone in the hard decorative member as well as the amounts of the metal element and the non-metallic element in the reaction compound can be controlled by adjusting the kinds and percentages of the atoms included in the target as well as the selection and amount of the reactant gas.

The hard decorative member may further include one or two or more layers selected from an adhesion layer, a hardening layer, and a gradient adhesion layer as the above-described hard decorative coating film as mentioned above, and the layers can be layered according to the gray-tone layer layering step mentioned above. The amounts of the metal element and the non-metallic element in the reaction compound can be adjusted in the above-mentioned ranges by adjusting the kind and percentages of the atoms included in the target as well as the selection and amount of the reactant gas.

When the adhesion layer is a Ti coating film or an alloy coating film of Ti and one or two or more metals M2 selected from Nb, Ta, and V, the adhesion layer can be layered by performing the same step as the gray-tone layer layering step mentioned above except that the reactant gas is not used.

When the antifouling coating layer is further layered on the above-described hard decorative coating film as mentioned above, examples of such a method include: a PVD method in which a solvent in which a fluorine resin having a fluorine-modified group and a reactive functional group is dissolved is heated and evaporated to be subjected to coating in a vacuum chamber; a dipping method in which a substrate is dipped in a solvent in which a fluorine resin is dissolved, and pulled up to coat the substrate; a spin coating method in which a solvent in which a fluorine resin is dissolved is dropwise added to a substrate that rotates at a high speed, to be subjected to coating; and the like, which are variously selected depending on the shape of the member or a layering thickness.

A production method of Embodiment H is more specifically explained. In other words, the production method of Embodiment H is a method for producing a hard decorative member including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon; an adhesion layer, a gradient adhesion layer, and a hardening layer are further included as the hard decorative coating film; the adhesion layer, the gradient adhesion layer, the hardening layer, and the gray-tone layer are layered in this order on the base; the gradient adhesion layer comprises a compound formed by a reaction of an alloy of Ti and one or two or more metals M2 selected from Nb, Ta, and V with one or two non-metallic elements selected from carbon and nitrogen, and the amount of the non-metallic element in the gradient adhesion layer is increased with increasing a distance from the base; the hardening layer comprises a compound formed by a reaction of an alloy of Ti and one or two or more metals M2 selected from Nb, Ta, and V with one or two non-metallic elements selected from carbon and nitrogen, the amount of the non-metallic element in the hardening layer is equal to or more than the total amount of carbon and nitrogen in a surface, closer to the hardening layer, in the gradient adhesion layer, and the hardening layer has higher hardness than the gray-tone layer; the amount of the non-metallic element in a surface, closer to the hardening layer, in the gray-tone layer is equal to or more than the amount of the non-metallic element in the hardening layer; and the method includes: a gradient adhesion layer layering step in which the gradient adhesion layer is layered on the adhesion layer while increasing the amount of a reactant gas including the non-metallic elements using an alloy target of Ti and one or two or more metals M2 selected from Nb, Ta, and V by a reactive sputtering method; and a gray-tone layer layering step in which the gray-tone layer is layered on the hardening layer using an alloy target of Ti and one or two or more metals M2 selected from Nb, Ta, and V by a reactive sputtering method.

Specifically, first, the adhesion layer layering step in which the adhesion layer mentioned above is layered on the base by the sputtering method is performed prior to the gradient adhesion layer layering step.

Then, preferably, an alloy in which Ti, a metal M2, and a metal M3 used as needed are combined, or more specifically, a sintered body of the above-described metal alloy is used as the target in the gradient adhesion layer layering step. In the above-described sintered body, the kinds and percentages of Ti, the metal M2, and the metal M3 used as needed are the same as those explained for the gradient adhesion layer mentioned above.

Examples of the reactant gas include carbon atom-containing gases such as methane gas and acetylene gas; and nitrogen atom-containing gases such as nitrogen gas and ammonia. Examples of the inert gas include Ar gas, Kr gas, and Xe gas.

In the gradient adhesion layer layering step, for example, under the condition of the inert gas at 100 to 200 sccm, only a carbon atom-containing gas or only a nitrogen atom-containing gas is introduced while increasing the gas from more than 0 sccm to 150 sccm to form a carbide film or a nitride film, or a reactant gas in which a carbon atom-containing gas or a nitrogen atom-containing gas is mixed with an oxygen atom-containing gas is introduced while increasing the gas from more than 0 sccm to 150 sccm to form an oxycarbonitride film or an oxynitride film, although the conditions of the step vary depending on a production apparatus and the composition of a target used. When the gas amount is in the above-described range, the amount of the non-metallic element in the reaction compound can be adjusted into the range explained for the gradient adhesion layer mentioned above. In other words, the gradient adhesion layer in which the amount of the non-metallic element is increased with increasing a distance from the base and the total amount of Ti and the metal M2 is decreased with increasing a distance from the base can be layered.

The gas amount can be adjusted by a mass flow controller which is automatically controlled, and the film thickness of the gradient adhesion layer can be controlled by sputtering time.

Then, a hardening layer layering step in which a hardening layer is layered on the gradient adhesion layer using an alloy target of Ti and one or two or more metals M2 selected from Nb, Ta, and V by a reactive sputtering method is performed prior to the gray-tone layer layering step.

Preferably, an alloy in which Ti, a metal M2, and a metal M3 used as needed are combined, or more specifically, a sintered body of the above-mentioned metal alloy is used as the target in the hardening layer layering step. In the above-described sintered body, the kinds and percentages of Ti, the metal M2, and the metal M3 used as needed are the same as those explained for the hardening layer mentioned above.

Examples of the reactant gas and the inert gas include gases similar to those in the gradient adhesion layer layering step.

In the hardening layer lamination step, for example, under the condition of the inert gas at 100 to 200 sccm, only a carbon atom-containing gas is introduced in an amount of 10 to 150 sccm which is equal to the amount of the carbon atom-containing gas or the nitrogen atom-containing gas at the time of finishing the gradient adhesion layer layering step or more than the amount by a range of more than 0 sccm and 50 sccm or less, to form a carbide film, or a reactant gas in which a carbon atom-containing gas and a nitrogen atom-containing gas are mixed is introduced in an amount of 10 to 150 sccm which is equal to the amount of the carbon atom-containing gas or the nitrogen atom-containing gas at the time of finishing the gradient adhesion layer layering step or more than the amount by a range of more than 0 sccm and 50 sccm or less, to form a carbonitride film, although the conditions of the step vary depending on a production apparatus and the composition of a target used. When the gas amount is in the above-described range, the amount of the non-metallic element in the reaction compound can be adjusted into the range explained for the hardening layer mentioned above. Furthermore, the amount of the non-metallic element in the hardening layer can be allowed to be equal to or more than the amount of the non-metallic element in the surface, closer to the hardening layer, in the gradient adhesion layer.

The gas amount can be adjusted by a mass flow controller which is automatically controlled, and the film thickness of the hardening layer can be controlled by sputtering time.

Finally, the gray-tone layer layering step in which the gray-tone layer is layered on the hardening layer using an alloy target of Ti and one or two or more metals M2 selected from Nb, Ta, and V by the reactive sputtering method is performed.

Preferably, an alloy in which Ti, a metal M2, and a metal M3 used as needed are combined, or more specifically, a sintered body of the above-mentioned metal alloy is used as the target in the gray-tone layer layering step. In the above-described sintered body, the kinds and percentages of Ti, the metal M2, and the metal M3 used as needed are the same as those explained for the gray-tone layer mentioned above.

Examples of the reactant gas and the inert gas include gases similar to those in the gradient adhesion layer layering step.

In the gray-tone layer layering step, for example, under the condition of the inert gas at 100 to 200 sccm, only a carbon atom-containing gas is introduced in an amount of 20 to 200 sccm, preferably 20 to 150 sccm, which is equal to the amount in the hardening layer layering step or more than the amount by a range of more than 0 sccm and 50 sccm or less, to form a carbide film, or a reactant gas in which a carbon atom-containing gas is mixed with a nitrogen atom-containing gas or an oxygen atom-containing gas is introduced in an amount of 20 to 200 sccm, preferably 20 to 150 sccm, which is equal to the amount in the hardening layer layering step or more than the amount by a range of more than 0 sccm and 50 sccm or less, to form a carbonitride film, an oxycarbide film, or an oxynitrocarbide film, although the conditions of the step vary depending on a production apparatus and the composition of a target used. In the mixed reactant gas, the carbon atom-containing gas preferably makes up 80% or more of the total amount of the mixed gas. When the gas amount is in the above-described range, the amount of the non-metallic element in the reaction compound can be adjusted into the range explained for the gray-tone layer mentioned above. Furthermore, the amount of the non-metallic element in the surface, closer to the hardening layer, in the gray-tone layer can be allowed to be equal to or more than the amount of the non-metallic element in the hardening layer.

The gas amount can be adjusted by a mass flow controller which is automatically controlled, and the film thickness of the gray-tone layer can be controlled by sputtering time.

According to the above production method, the hard decorative member having such properties as mentioned above can be obtained.

<Decorative Article Including Hard Decorative Member>

Examples of the decorative article including the hard decorative member include glasses, accessories, timepieces, sporting goods, and the like. A part or the whole of each of these decorative articles may include the above-described hard decorative member.

Such a timepiece may be any one of photovoltaic timepieces, thermoelectric generating timepieces, electric wave reception type self-correction timepieces, mechanical timepieces, and general electronic timepieces. Such a timepiece is produced by a known method using the above-described hard decorative member. In particular, a watch is an example of decorative articles which are easily scratched due to a rub with a shirt or to collision with a desk, a wall, or the like. By forming the hard decorative member of the present invention on such a timepiece, the timepiece can be inhibited from being scratched, to maintain its color tone and appearance in very beautiful states, for many years.

On the basis of the above, the present invention relates to, for example, the following (1) to (13):

(1) A hard decorative member, including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon.

Such a hard decorative member is excellent in corrosion resistance as well as scratch resistance.

(2) The hard decorative member according to (1), wherein an amount of carbon contained in the gray-tone layer is 30 to 70 atm % in a total amount of Ti, the metal M2, and the non-metallic element of 100 atm %.

Such a hard decorative member has a deeper gray tone.

(3) The hard decorative member according to (1) or (2), wherein an amount of Ti contained in the gray-tone layer is 20 to 90 mass % in a total amount of Ti and the metal M2 of 100 mass %.

Such a hard decorative member has a deeper gray tone as well as higher hardness.

(4) The hard decorative member according to any one of (1) to (3), wherein the gray-tone layer has a thickness of 0.2 μm or more.

It is preferable to have such a thickness from the viewpoint of a color tone.

(5) The hard decorative member according to any one of (1) to (4), wherein in the gray-tone layer, a difference between a maximum value and a minimum value is 10% or less in reflectance measurement in a visible region (360 to 740 nm), and L* is more than 60 and 73 or less, each of a* and b* is −2.0 to 2.0, and a difference between a* and b* is 1.5 or less in Lab color space display.

Such a hard decorative member has a deeper gray tone.

(6) The hard decorative member according to any one of (1) to (5), wherein the gray-tone layer has a hardness of HV1500 or more.

Such a hard decorative member is superior in scratch resistance.

(7) The hard decorative member according to any one of (1) to (6), further including an adhesion layer as the hard decorative coating film, wherein the adhesion layer is layered between the base and the gray-tone layer.

Such a hard decorative member has a high degree of adhesion and is superior in scratch resistance.

(8) The hard decorative member according to any one of (1) to (6), further including a hardening layer as the hard decorative coating film, wherein the hardening layer is layered between the base and the gray-tone layer; and the hardening layer has higher hardness than the gray-tone layer.

Such a hard decorative member has high hardness and is superior in scratch resistance.

(9) The hard decorative member according to any one of (1) to (6), further including an adhesion layer, a gradient adhesion layer, and a hardening layer as the hard decorative coating film, wherein the adhesion layer, the gradient adhesion layer, the hardening layer, and the gray-tone layer are layered in this order on the base;

the gradient adhesion layer comprises a compound formed by a reaction of an alloy of Ti and one or two or more metals M2 selected from Nb, Ta, and V with one or two non-metallic elements selected from carbon and nitrogen, and an amount of the non-metallic element in the gradient adhesion layer is increased with increasing a distance from the base;

the hardening layer comprises a compound formed by a reaction of an alloy of Ti and one or two or more metals M2 selected from Nb, Ta, and V with one or two non-metallic elements selected from carbon and nitrogen, an amount of the non-metallic element in the hardening layer is equal to or more than a total amount of the carbon and the nitrogen in a surface, closer to the hardening layer, in the gradient adhesion layer, and the hardening layer has higher hardness than the gray-tone layer; and an amount of the non-metallic element in a surface, closer to the hardening layer, in the gray-tone layer is equal to or more than an amount of the non-metallic element in the hardening layer.

Such a hard decorative member is particularly excellent in scratch resistance.

(10) The hard decorative member according to (8) or (9), wherein the hardening layer has a thickness of 0.5 to 4.0 µm.

Such a hard decorative member has high hardness and is superior in scratch resistance.

(11) The hard decorative member according to any one of (1) to (10), wherein an antifouling coating layer is further layered on the hard decorative coating film.

In such a hard decorative member, a color tone and scratch resistance can be maintained for a long term.

(12) A method for producing a hard decorative member including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon; and the method includes a gray-tone layer layering step in which a gray-tone layer is layered on the base using an alloy target of Ti and one or two or more metals M2 selected from Nb, Ta, and V by a reactive sputtering method.

According to such a production method, a hard decorative member superior in corrosion resistance as well as scratch resistance is obtained.

(13) A method for producing a hard decorative member including a base and a hard decorative coating film layered on the base, wherein the hard decorative coating film includes a gray-tone layer comprising a compound formed by a reaction of an alloy of Ti and one or two or more metals M2 selected from Nb, Ta, and V with a non-metallic element including at least carbon;

an adhesion layer, a gradient adhesion layer, and a hardening layer are further included as the hard decorative coating film;

the adhesion layer, the gradient adhesion layer, the hardening layer, and the gray-tone layer are layered in this order on the base;

the gradient adhesion layer comprises a compound formed by a reaction of an alloy of Ti and one or two or more metals M2 selected from Nb, Ta, and V with one or two non-metallic elements selected from carbon and nitrogen, and an amount of the non-metallic element in the gradient adhesion layer is increased with increasing a distance from the base;

the hardening layer comprises a compound formed by a reaction of an alloy of Ti and one or two or more metals M2 selected from Nb, Ta, and V with one or two non-metallic elements selected from carbon and nitrogen, an amount of the non-metallic element in the hardening layer is equal to or more than a total amount of the carbon and the nitrogen in a surface, closer to the hardening layer, in the gradient adhesion layer, and the hardening layer has higher hardness than the gray-tone layer;

an amount of the non-metallic element in a surface, closer to the hardening layer, in the gray-tone layer is equal to or more than an amount of the non-metallic element in a surface, closer to the gray-tone layer, in the hardening layer; and the method includes:

a gradient adhesion layer layering step in which the gradient adhesion layer is layered on the adhesion layer while increasing an amount of a reactant gas including the non-metallic element using an alloy target of Ti and one or two or more metals M2 selected from Nb, Ta, and V by a reactive sputtering method; and a gray-tone layer layering step in which the gray-tone layer is layered on the hardening layer using an alloy target of Ti and one or two or more metals M2 selected from Nb, Ta, and V by a reactive sputtering method.

According to such a production method, a hard decorative member particularly excellent in scratch resistance is obtained.

EXAMPLES

The present invention will be further specifically explained below based on examples. However, the present invention is not limited to the examples.

<Measurement Method>

[Amount of Element]

The amount of each element in each layer was measured by ESCA (X-ray photoelectron spectroscopy) and an EPMA (electron probe microanalyzer) method. In ESCA, an element qualitatively determined on a member surface was sputter-etched from a top surface, and the XPS photoelectron spectrum of each obtained element was detected and quantitatively determined. In EPMA, a sample surface was irradiated with electron rays under the conditions of an acceleration voltage of 15 kV, a probe current of $5 \times 10^{-8}$, and a probe diameter of 100 µm, and the spectrum of the generated characteristic X-rays was analyzed to qualitatively and quantitatively determine each element. In addition, ZAF correction of C was performed using calculation strength.

[Film Thickness]

In the simple measurement of the film thickness of each layer, a Si wafer on which a mask was formed was introduced together with a base into a film formation apparatus, the mask was removed after film formation, and a level difference between a portion on which the mask had been formed and a portion on which the masked had not been formed was measured to thereby measure the film thickness.

[Color Tones]

The color tones of a hard decorative member were evaluated by measuring L*a*b* with an L*a*b* chromaticity diagram using Spectra Magic NX (light source D65) manufactured by KONICA MINOLTA.

[Reflectance]

For the reflectance of the hard decorative member, a spectral reflectance in a visible region of 360 to 740 nm was measured using Spectra Magic NX (light source D65) manufactured by KONICA MINOLTA.

[Determination of Color Tones]

In determination of color tones, a case that satisfies all of (1) to (4) was determined as good, and a case that does not satisfy at least one of (1) to (4) was determined as poor: (1) lightness (L*) satisfies 60<L*≤73; (2) color tones a* and b* satisfy −2.0≤a*, b*≤2.0; (3) a difference between a* and b* (|a*−b*|) is 1.5 or less (0 or more and 1.5 or less); and (4) a difference between a maximum value and a minimum value in the visible region (360 to 740 nm) in reflectance measurement is 10% or less (0% or more and 10% or less).

For lightness, 73<L*≤90 was determined as white (silver), 60<L*≤73 was determined as gray, 40<L*≤60 was determined as dark gray, and L*≤40 was determined as black.

[Hardness]

For film hardness, a nano-indentation hardness tester (H100, manufactured by FISCHER) was used. A Vickers indenter was used as a gauge head, held at a load of 5 mN for 10 seconds, and then unloaded, and the film hardness was calculated from the depth of the inserted Vickers indenter.

The hardness of a hard decorative member (Embodiment H) in which an adhesion layer, a gradient adhesion layer, a hardening layer, and a gray-tone layer were layered on a base was also measured in a method similar to the above-described method, and the measurement result in overall Embodiment H was regarded as the hardness of the member.

[Scratch Resistance]

For the scratch resistance of a hard decorative member, a decorative film was applied to a base, and abrasion paper in which alumina particles were homogeneously dispersed was brought into contact with a test sample at a certain load, and was rubbed therewith the certain number of times, whereby flaws were generated. The surface of the flawed test sample was scanned in the direction orthogonal to the direction of the flaws to measure surface roughness, and the scratch resistance was evaluated as root-mean-square roughness. Since the numerical value of the root-mean-square roughness is increased with increasing the amount of the generated flaws or with increasing the depths of the flaws while the numerical value of the root-mean-square roughness is conversely decreased with decreasing the amount of the generated flaws or with decreasing the depths of the flaws, the scratch resistance can be numerically evaluated.

[Corrosion Resistance]

The corrosion resistance of a hard decorative member was evaluated by a CASS test, an artificial sweat test, and an acid and alkali dipping test. In the CASS test according to JIS-H8502, the member was put for 48 hours in an atmosphere in which a solution obtained by adding cupric chloride to a sodium chloride solution with acetic acid acidity was sprayed, and the peeling and discoloration of a decorative film were observed to evaluate its corrosion resistance.

In the artificial sweat test according to ISO 12870, the member was put in an atmosphere in which a liquid in which sodium chloride and lactic acid were mixed (artificial sweat) was aerated at 55° C. for 48 hours, and the discoloration of a decorative film was observed to evaluate its corrosion resistance.

In the acid test, the member was dipped in 20% aqueous solutions of sulfuric acid, hydrochloric acid, and phosphoric acid under the conditions of 2 hours and 30° C., and the discoloration of a decorative film was observed to evaluate its corrosion resistance.

In the alkali dipping test, the member was dipped in a 5% aqueous sodium hydroxide solution under the conditions of 2 hours and 30° C. and dipped in a 6% aqueous sodium hypochlorite solution under the conditions of 2 hours and 30° C., and the peeling and discoloration of a decorative film were observed to evaluate corrosion resistance.

Criteria for evaluating corrosion resistance were as follows:

Good: ΔE*ab is 0.8 or less in determination of a color difference, and neither peeling nor pitting corrosion occurs.

Fair: ΔE*ab is more than 0.8 and 1.6 or less in determination of a color difference, and neither peeling nor pitting corrosion occurs.

Poor: ΔE*ab is more than 1.6 in determination of a color difference, or peeling and pitting corrosion occur.

For determination of a color difference, calculation is carried out from a color difference before and after a test. When the color tones of a film before the test are (L*, a*, b*) and the color tones of the film after the test are (L1*, a1*, b1*), the color difference is calculated from [[L*−L1*]^2+ [a*−a1*]^2+(b*−b1*) ^2]^0.5.

Example 1

First Example of the gray-tone hard decorative member of the present invention is explained with reference to FIG. 4, FIG. 5, FIG. 6, Table 1, Table 2, Table 3, and Table 4. FIG. 4 is a cross-sectional schematic view of a gray-tone hard decorative member 40, FIG. 5 is a view showing the measurement of the scratch resistance of the decorative member 40, FIG. 6 is a cross-sectional schematic view of a comparative example produced based on Non Patent Literature 1, Table 1 shows the results of hardness, color tones, a color tone difference (|a*−b*|), a difference between a maximum value and a minimum value in reflectance measurement in the visible region (360 to 740 nm), and determination of color tones in a carbide with 45 mass % Ti and 55 mass % Nb, Table 2 and Table 3 show the measurement results of a TiC film and a NbC film, Table 4 shows the results of the measurement of the amount of carbon by ESCA, and Table 5 shows the results of the comparison of corrosion resistance.

A sintered body having an alloy composition of 45 mass % Ti and 55 mass % Nb was used as a sputtering target. As illustrated in FIG. 1 (Embodiment A), an SUS316L material specified in JIS was used as a base 41, and an argon gas at 105 sccm and a methane gas at 35 sccm were introduced, to form a TiNb alloy carbide film 42 of 0.8 μm on the base 41 by a sputtering method and to produce the gray-tone hard decorative member 40. The appearance color of the gray-tone hard decorative member 40 obtained in such a manner exhibited a deep gray tone with L*: 70.92, a*: 0.93, and b*: 0.42 in Lab color space display.

Table 1 shows the results of hardness, lightness (L*), color tones (a*, b*), a difference between a* and b* (|a*−b*|), a difference between a maximum value and a minimum value in reflectance measurement in the visible region (360 to 740 nm), and determination of color tones in the TiNb alloy carbide film produced by changing the amount of methane gas in the TiNb alloy.

In addition, Table 2 and Table 3 show, as comparisons, the results of hardness, lightness (L*), color tones (a*, b*), differences between a* and b* (|a*−b|), differences between maximum values and minimum values in reflectance measurement in the visible region (360 to 740 nm), and determination of color tones in the TiC film and the NbC film produced by changing the amount of methane gas.

TABLE 1

Carbide Film with 45 mass % Ti and 55 mass % Nb

| Reactant Gas | Hardness | Results of Measurement of Color Tones | | | | Reflectance Difference (Maximum Value − Minimum Value) | Determination of Color Tones |
|---|---|---|---|---|---|---|---|
| $CH_4$ | HV | L* | a* | b* | \|a* − b*\| | | |
| 0 | 547 | 76.85 | 1.18 | 1.63 | 0.45 | 12.45 | Poor |
| 10 | 1179 | 77.02 | 1.24 | 2.75 | 1.51 | 15.19 | Poor |
| 20 | 1832 | 76.5 | 1.15 | 3.98 | 2.83 | 15.55 | Poor |
| 30 | 2858 | 74.75 | 1.48 | 3.97 | 2.49 | 15 | Poor |
| 35 | 2784 | 70.92 | 0.93 | 0.42 | 0.51 | 8.47 | Good |
| 40 | 2579 | 69.53 | 0.72 | 0.51 | 0.21 | 6.2 | Good |
| 45 | 2398 | 67.11 | 0.72 | 0.81 | 0.09 | 8.02 | Good |
| 50 | 1919 | 65.23 | 0.74 | 1.41 | 0.67 | 8.45 | Good |
| 65 | 1668 | 64.1 | 0.74 | 0.95 | 0.21 | 6.44 | Good |

TABLE 2

TiC Film

| Reactant Gas | Hardness | Results of Measurement of Color Tones | | | | Reflectance Difference (Maximum Value − Minimum Value) | Determination of Color Tones |
|---|---|---|---|---|---|---|---|
| $CH_4$ | HV | L* | a* | b* | \|a* − b*\| | | |
| 0 | 377 | 78.88 | 1.21 | 3.1 | 1.89 | 14.69 | Poor |
| 10 | 1018 | 75.24 | 1.67 | 3.82 | 2.15 | 16.22 | Poor |
| 15 | 1330 | 73.37 | 2.04 | 4.36 | 2.32 | 17.87 | Poor |
| 20 | 1855 | 73.04 | 1.4 | 2.96 | 1.56 | 14.41 | Poor |
| 25 | 2692 | 72.82 | 0.72 | 2.16 | 1.44 | 10.11 | Poor |
| 30 | 2336 | 71.03 | 0.52 | 2.18 | 1.66 | 10.14 | Poor |
| 35 | 2211 | 69.53 | 0.75 | 3.1 | 2.35 | 11.44 | Poor |
| 40 | 2089 | 69.86 | 0.77 | 2.95 | 2.18 | 12.44 | Poor |
| 45 | 2089 | 65.16 | 0.68 | 2.87 | 2.19 | 12.57 | Poor |
| 65 | 1194 | 58.11 | 0.47 | 1.8 | 1.33 | 5.51 | Poor |

TABLE 3

NbC Film

| Reactant Gas | Hardness | Results of Measurement of Color Tones | | | | Reflectance Difference (Maximum Value − Minimum Value) | Determination of Color Tones |
|---|---|---|---|---|---|---|---|
| $CH_4$ | HV | L* | a* | b* | \|a* − b*\| | | |
| 0 | 711 | 79.02 | 0.9 | 3.99 | 3.09 | 20.63 | Poor |
| 10 | 1594 | 78.84 | 1.2 | 4.16 | 2.96 | 16.14 | Poor |
| 20 | 2197 | 79.25 | 0.78 | 3.03 | 2.25 | 12.04 | Poor |
| 25 | 2568 | 78.29 | 0.67 | 3.73 | 3.06 | 14.64 | Poor |
| 30 | 3151 | 78.32 | 0.7 | 3.89 | 3.19 | 14.83 | Poor |
| 35 | 2814 | 77.73 | 1.59 | 5.9 | 4.31 | 22.60 | Poor |
| 40 | 2683 | 74.03 | 3.5 | 8.2 | 4.7 | 25.50 | Poor |
| 50 | 2432 | 70.5 | 4.5 | 12.1 | 7.6 | 27.28 | Poor |
| 65 | 1980 | 68 | 5 | 14.2 | 9.2 | 28.00 | Poor |

Table 1 reveals that the film with a deeper gray tone is obtained on the condition of introducing methane gas at 35 sccm or more in the TiNbC film. As a result of ESCA measurement, the amount of carbon existing in an alloy coating film at the time of the introduction of 35 sccm was 34.6 atm %.

Table 4 shows the results of quantitative determination of analysis of elements in a NbTiC film with ESCA analysis. Table 4 reveals that a gray color with a sense of high quality is obtained in a range of 34.6 atm % to 59.4 atm %.

TABLE 4

Quantitative Measurement of Amount of Elements in Carbide Film with 45 mass % Ti and 55 mass % Nb

| $CH_4$ (sccm) | Ti | Nb | C | Others |
|---|---|---|---|---|
| 30 | 38.9 | 30.1 | 29.7 | 1.3 |
| 35 | 37.2 | 25.9 | 34.6 | 2.3 |
| 40 | 34.5 | 18.3 | 43.5 | 3.7 |
| 50 | 27.9 | 19.5 | 49.1 | 3.5 |
| 65 | 20.7 | 18.3 | 59.4 | 1.6 |

Table 2 shows that the TiC film is not able to be considered to be a decorative member having highly maintained scratch resistance and a deep gray tone because lightness L* is as low as 58.11, exhibiting an almost black color rather than a gray color, and in addition, the film hardness does not reach HV1500 or more although the values of the color tones (a*, b*) satisfy −2.0≤a*, b*≤2.0 and the difference between a* and b* (|a*−b*|) is 1.5 or less when methane gas is introduced at 65 sccm or more.

Table 3 shows that the NbC film is not able to be also considered to be a decorative member having highly maintained scratch resistance and a deep gray tone because both color tones (a*, b*) are increased in proportion to the amount of introduced methane gas, and the NbC film exhibits yellow to brown.

Only in a TiNbC film comprising an alloy of Nb and Ti, a gray-tone decorative member having high scratch resistance is obtained because the TiNbC film exhibits a deep gray tone and has a film hardness of HV1500 or more.

FIG. 5 is a view showing the measured scratch resistance of the gray-tone hard decorative member 40 produced in Example 1. The figure shows, as comparisons, the results of the measured scratch resistances (root-mean-square roughnesses) of a decorative member 110 in which a TiC film 112 of 0.8 μm produced based on Non Patent Literature 1 and having hardness equivalent to HV1100 was formed on an SUS316L base 111, and an SUS316L base on which no hard film was formed. It was confirmed from FIG. 5 that the gray-tone hard decorative member 40 of Example 1 of the present invention had much better scratch resistance performance than the decorative member 110 produced based on Non Patent Literature 1 as well as the SUS316L base on which no hard film was formed. Since scratch resistance is determined nearly by the product of the hardness, film thickness, and degree of adhesion with a base of an entire hardening layer layered on the base, the decorative member 40 having hardness two or more times the hardness of the decorative member 110 can be improved in scratch resistance performance.

Since scratch resistance performance is determined nearly by the product of the hardness, film thickness, and degree of adhesion with a base of an entire hardening layer layered on the base, the scratch resistance performance is improved with increasing the film thickness. However, it was difficult to form each film having a thickness of 0.8 μm or more in view of adhesion and film stress in Example 1 and Comparative Example 1.

Table 5 shows the results of the evaluation of the corrosion resistance of the decorative member 40. As comparisons, the results of a TiC film and a NbC film produced by introducing gas having the same amount (methane gas at 35 sccm) are shown together. Table 5 reveals that a decorative film having high corrosion resistance in combination with each feature is obtained in a NbTiC carbide film in which Ti excellent in alkali resistance and sodium hypochlorite resistance and Nb excellent in acid resistance are alloyed.

TABLE 5

Corrosion Resistance of Carbide Film with 45 mass % Ti and 55 mass % Nb

| | CASS Test | Artificial Sweat Test | Sulfuric Acid | Hydrochloric Acid | Phosphoric Acid | NaOH 10% | Sodium hypochlorite |
|---|---|---|---|---|---|---|---|
| TiC (methane at 35 sccm) | Good | Good | Poor (peeling) | Poor | Poor (peeling) | Good | Good |
| NbC (methane at 35 sccm) | Good | Good | Good | Good | Good | Poor | Poor |
| NbTiC (methane at 35 sccm) | Good | Good | Good | Good | Good | Good | Good |

Furthermore, since Ti and Nb included in the gray-tone hard decorative member 40 are materials that do not induce an allergic reaction in the human body, the member can be used as an ornament in consideration for resistance to metal allergies.

Example 2

Second Example of the gray-tone hard decorative member of the present invention is explained with reference to FIG. 7, FIG. 8, and FIG. 9. FIG. 7 is a cross-sectional schematic view of a gray-tone hard decorative member 50, FIG. 8 is a view showing the measurement of the scratch resistance of the decorative member 50, and FIG. 9 is a cross-sectional schematic view of a comparative example produced based on Patent Literature 1.

A sintered body having an alloy composition of 45 mass % Ti and 55 mass % Nb was used as a sputtering target, similarly to Example 1. As illustrated in FIG. 7 (Embodiment B), an SUS316L material specified in JIS was used as a base 51, an argon gas at 105 sccm and an oxygen gas at 5 sccm were introduced to form an adhesion layer 52 of 0.1 µm comprising a lower oxide of a TiNb alloy on the base 51 by a sputtering method, and then, a methane gas was introduces at 35 sccm while introducing an argon gas at 105 sccm, to form a TiNb alloy carbide film 53 of 1.3 µm and to produce the gray-tone hard decorative member 50. The appearance color of the gray-tone hard decorative member 50 obtained in such a manner exhibited a deep gray tone with L*: 70.99, a*: 0.95, and b*: 0.77 in Lab color space display. The difference between a maximum value and a minimum value in the visible region (360 to 740 nm) in reflectance measurement was 8.52%.

Because the gray-tone hard decorative member of Example 2 comprises the alloy adhesion layer with a high adhesion effect on the base and a gray-tone layer having high hardness, adhesion between the base and the film is improved, and the thicker gray-tone layer having high film hardness than that in Example 1 can be formed. Furthermore, the introduction of a slight amount of oxygen into the adhesion layer enables adhesiveness between the base and the film to be strengthened by a cross-linking effect due to the two hands of oxygen. Scratch resistance is determined by the product of the hardness, film thickness, and degree of adhesion with a base of a hardening layer layered on the base, the film having a more thickness can be therefore formed in the gray-tone hard decorative member of Example 2 than that in Example 1, and scratch resistance can be therefore improved.

In the adhesion layer 52 of the gray-tone hard decorative member 50, an argon gas at 105 sccm and an oxygen gas at 5 sccm were introduced under the condition of an amount of introduced methane gas of 0 sccm, to form a TiNb lower oxide film of 0.1 µm. The formation of the TiNb lower oxide can result in more adhesiveness with the base than the TiNb alloy film and in improvement in scratch resistance. In the gray-tone layer 53, an argon gas at 105 sccm and a methane gas at 35 sccm were introduced to form a TiNb alloy carbide film of 1.3 pun.

FIG. 8 shows the results of the measured scratch resistance performance of the gray-tone hard decorative member 50 produced in Example 2. The figure shows, as comparisons, the results of the measured scratch resistances (root-mean-square roughnesses) of a decorative member 120 illustrated in FIG. 9 and produced based on Patent Literature 1, the gray-tone hard decorative member 50 of Example 2 according to the present invention, and an SUS316L base on which no hard film was formed. It was confirmed from FIG. 8 that the gray-tone hard decorative member 50 of Example 2 of the present invention had much better scratch resistance performance than the decorative member 120 produced based on Patent Literature 1 as well as the SUS316L base on which no hard film was formed.

For the decorative member 120 as a comparative example, an SUS316L material specified in JIS was used as a base 121, an adhesion layer 122 of Ti of 0.1 µm was formed on the base 121 by an ion plating method, a TiC film 123 of 0.6 µm equivalent to HV1100 was then formed, and a Pt layer 124 of 0.005 µm was further formed as a finishing layer, to produce the decorative member 120.

Similarly to Table 5 of Example 1, the results of the evaluation of the corrosion resistance in Example 2 show high corrosion resistance performance to acids and alkalis.

Example 3

Third Example of the gray-tone hard decorative member of the present invention is explained with reference to FIG. 10 and FIG. 11. FIG. 10 is a cross-sectional schematic view of a gray-tone hard decorative member 60, and FIG. 11 is a view showing the measurement of the scratch resistance of the decorative member 60.

A sintered body having an alloy composition of 45 mass % Ti and 55 mass % Nb was used as a sputtering target, similarly to Example 1. As illustrated in FIG. 10, an SUS316L material specified in JIS was used as a base 61, and an adhesion layer 62 of 0.1 µm comprising a lower oxide of a TiNb alloy was formed on the base 61 by a sputtering method. Then, a gradient adhesion layer 63 of 0.2 µm of a TiNb alloy oxynitride film in which a nitrogen gas was increased in a gradient manner while introducing a slight amount of oxygen gas was formed. Then, a hardening layer 64 of 1.7 µm comprising a TiNb alloy nitride film was formed. Then, a gray-tone layer 65 of 0.3 µm of a TiNb alloy carbide film in which a methane gas was increased in a gradient manner was formed. The appearance color of the gray-tone hard decorative member 60 obtained in Example 3 exhibited a deep gray tone with L*: 69.77, a*: 0.59, and b*: 0.79 in Lab color space display. The difference between a maximum value and a minimum value in the visible region (360 to 740 nm) in reflectance measurement was 7.95%.

For the adhesion layer 62 of the gray-tone hard decorative member 60, an oxygen gas was introduced at 3 sccm under the fixed condition of an argon gas at 105 sccm, to form a TiNb alloy lower oxide film of 0.1 µm. The formation of the TiNb alloy lower oxide can result in more adhesiveness with the base than the TiNb alloy film and in improvement in scratch resistance. In the gradient adhesion layer 63, the TiNb alloy oxynitride film of 0.2 µm was formed in which the amount of introduced nitrogen gas was increased in a gradient manner from 0 sccm to 25 sccm exhibiting maximum hardness while introducing an oxygen gas at 3 sccm. In the hardening layer 64, the TiNb alloy nitride film of 1.7 µm was formed under the condition of an amount of introduced nitrogen gas of 25 sccm exhibiting maximum hardness. In the gray-tone layer 65, the TiNb alloy carbide film of 0.3 µm was formed in which the methane gas was increased in a gradient manner from 25 sccm to 35 sccm. In the gray-tone layer 65, the film thickness of a gradient portion formed by increasing the amount of the methane gas from 25 sccm to 35 sccm was around 0.05 µm, the film thickness of a portion formed by introducing the methane gas at an amount of 35 sccm was around 0.25 µm, and the gray-tone layer 65 exhibited a deep gray tone.

In the gradient adhesion layer 63 in the gray-tone hard decorative member 60 of Example 3, a definite interface between the adhesion layer and the hardening layer vanishes, and therefore, the base and the adhesion layer can be integrated. The presence of the gradient adhesion layer results in sufficient adhesiveness between the adhesion layer and the hardening layer and in a structure in which film stress is increased in a gradient manner, and therefore results in the effect of inhibiting generation of a crack and peeling due to stress strain, to improve scratch resistance and wear resistance and enables the thick hardening layer having high film hardness to be formed. Since scratch resistance is determined nearly by the product of the hardness, film thickness, and degree of adhesion with a base of an entire hardening layer layered on the base, scratch resistance in Example 3 can be markedly improved compared to those in Example 1 and Example 2.

The gray-tone layer 65 in the gray-tone hard decorative member 60 of Example 3 results in a mild change in the color tone due to increase in carbon content in a gradient manner, has high adhesiveness with the hardening layer 64, and also contributes to the effect of inhibiting peeling and making a scratch less noticeable even if the scratch is made.

FIG. 11 shows the results of the measured scratch resistance performance of the gray-tone hard decorative member 60 in Example 3. The figure shows, as comparisons, the results of the measured scratch resistances (root-mean-square roughnesses) of the decorative member 120 illustrated in FIG. 9 and produced based on Patent Literature 1, the gray-tone hard decorative member 60 of Example 3 according to the present invention, an SUS316L base on which no hard film was formed, and the decorative member 110 in which the TiC film of 0.8 μm illustrated in FIG. 6, produced based on Non Patent Literature 1, and having hardness equivalent to HV1100 was formed on the SUS316L base. It was confirmed from FIG. 11 that the gray-tone hard decorative member 60 of Example 3 of the present invention had much better scratch resistance performance than the decorative member 120 produced based on Patent Literature 1 and the decorative member 110 as well as the SUS316L base on which no hard film was formed.

Since scratch resistance performance is determined nearly by the product of the hardness, film thickness, and degree of adhesion with a base of an entire hardening layer layered on the base, the TiC film (decorative member 110) produced as the comparison was wanted to be formed to have a film thickness of 1.7 μm or more; however, since a crack and peeling were observed in the film having a film thickness of 0.9 μm or more when the TiC film was formed on the base without being processed, the film thickness was set at 0.8 μm.

Similarly to Table 4 of Example 1, the results of the evaluation of the corrosion resistance in Example 3 show high corrosion resistance performance to acids and alkalis. The film hardness of the entire gray-tone hard decorative member 60 was HV2470. The film hardness of the hardening layer was higher than the film hardness of the gray-tone layer.

Example 4

Fourth Example of the gray-tone hard decorative member of the present invention is explained with reference to FIG. 12, FIG. 13, Table 6, and Table 7. FIG. 12 is a cross-sectional schematic view of a gray-tone hard decorative member 70, FIG. 13 is a view showing the measurement of the scratch resistance of the decorative member 70, and Table 6 shows the results of hardness, color tones, a color tone difference (|a*−b*|), a difference between a maximum value and a minimum value in reflectance measurement in the visible region (360 to 740 nm), and determination of color tones in a carbide with 20 mass % Ti and 80 mass % Nb. Table 7 shows the results of the comparison of corrosion resistance.

A sintered body having an alloy composition of 20 mass % Ti and 80 mass % Nb was used as a sputtering target. As illustrated in FIG. 12 (Embodiment A), a Ti base specified in JIS2 class was used as a base 71, and an argon gas at 105 sccm and a methane gas at 30 sccm were introduced, to form a TiNb alloy carbide film 72 of 0.8 μm on the base 71 by a sputtering method and to produce the gray-tone hard decorative member 70. The appearance color of the gray-tone hard decorative member 70 obtained in such a manner exhibited a deep gray tone with L*: 70.35, a*: 1.24, and b*: 1.70 in Lab color space display.

Table 6 shows the results of hardness, lightness (L*), color tones (a*, b*), a difference between a* and b* (|a*−b*|), a difference between a maximum value and a minimum value in reflectance measurement in the visible region (360 to 740 nm), and determination of color tones in the TiNb alloy carbide film produced by changing the amount of methane gas in the TiNb alloy.

TABLE 6

| | Carbide Film with 20 mass % Ti and 80 mass % Nb | | | | | | |
|---|---|---|---|---|---|---|---|
| Reactant Gas | Hardness | Results of Measurement of Color Tones | | | | Reflectance Difference (Maximum Value − Minimum Value) | Determination of Color Tones |
| CH$_4$ | HV | L* | a* | b* | |a* − b*| | | |
| 0 | 542 | 76.93 | 1.26 | 2.03 | 0.77 | 14.45 | Poor |
| 10 | 1268 | 77.31 | 1.22 | 3.5 | 2.28 | 15.38 | Poor |
| 20 | 1961 | 77.05 | 1.04 | 4.13 | 3.09 | 15.31 | Poor |
| 25 | 2784 | 74.54 | 1.85 | 3.91 | 2.06 | 13.99 | Poor |
| 30 | 2963 | 70.35 | 1.24 | 1.7 | 0.46 | 9.87 | Good |
| 40 | 2422 | 69.3 | 1.17 | 0.51 | 0.66 | 9.03 | Good |
| 50 | 1903 | 67.87 | 1.03 | 0.74 | 0.29 | 8.31 | Good |
| 60 | 1844 | 64.68 | 0.88 | 1.19 | 0.31 | 7.11 | Good |
| 70 | 1558 | 61.3 | 0.64 | 1.08 | 0.44 | 8.41 | Good |

Table 6 reveals that the film with a deeper gray tone was obtained on the condition of introducing methane gas at 30 sccm or more in the TiNbC film. As a result of ESCA measurement, the amount of carbon existing in an alloy coating film at the time of the introduction of 30 sccm was 29.9 atm %.

On the basis of the results of Table 6 as well as TiC (Table 2) and NbC (Table 3) as comparisons, only in a TiNbC film comprising an alloy of Nb and Ti, a gray-tone decorative member having high scratch resistance is obtained because the TiNbC film exhibits a deep gray tone and has a film hardness of HV1500 or more.

FIG. 13 is a view showing the measured scratch resistance of the gray-tone hard decorative member 70 produced in Example 4. The figure shows, as comparisons, the results of the measured scratch resistances (root-mean-square roughnesses) of a decorative member 110 in which a TiC film of 0.8 μm produced based on Non Patent Literature 1 and having hardness equivalent to HV1100 was formed on a JIS2 class Ti base, and a JIS2 class Ti base on which no hard film was formed. It was confirmed from FIG. 13 that the gray-tone hard decorative member 70 of Example 1 of the present invention had much better scratch resistance performance than the decorative member 110 produced based on Non Patent Literature 1 as well as the JIS2 class Ti base on which no hard film was formed. Since scratch resistance is determined nearly by the product of the hardness, film thickness, and degree of adhesion with a base of an entire hardening layer layered on the base, the decorative member 70 having hardness around three times the hardness of the decorative member 110 can be improved in scratch resistance performance.

Since scratch resistance performance is determined nearly by the product of the hardness, film thickness, and degree of adhesion with a base of a hardening layer layered on the base, the scratch resistance performance is improved with increasing the film thickness. However, it was difficult to form each film having a thickness of 0.8 μm or more in view of adhesion and film stress in Example 4 and Comparative Example 1.

Table 7 shows the results of the evaluation of the corrosion resistance of the decorative member 70. As comparisons, the results of a TiC film and a NbC film produced by introducing gas having the same amount (methane gas at 30 sccm) are shown together. Table 7 reveals that a decorative film having high corrosion resistance in combination with each feature is obtained in a TiNbC carbide film in which Ti excellent in alkali resistance and sodium hypochlorite resistance and Nb excellent in acid resistance are alloyed.

84 of 2.0 μm comprising a TiNb alloy carbide film was formed. Then, a gray-tone layer 85 of 0.3 μm of a TiNb alloy carbide film in which a methane gas was increased in a gradient manner was formed. The appearance color of the gray-tone hard decorative member 80 obtained in Example 5 exhibited a deep gray tone with L*: 68.97, a*: 1.07, and b*: 0.57 in Lab color space display. The difference between a maximum value and a minimum value in the visible region (360 to 740 nm) in reflectance measurement was 7.75%.

For the adhesion layer 82 of the gray-tone hard decorative member 80, an oxygen gas was introduced at 3 sccm under the fixed condition of an argon gas at 105 sccm, to form a TiNb alloy lower oxide film of 0.1 μm. The formation of the TiNb alloy lower oxide can result in more adhesiveness with the base than the TiNb alloy film and in improvement in scratch resistance. In the gradient adhesion layer 83, the TiNb alloy oxycarbide film of 0.2 μm was formed in which the amount of introduced methane gas was increased in a gradient manner from 0 sccm to 30 sccm exhibiting maximum hardness while introducing an oxygen gas at 3 sccm. In the hardening layer 84, the TiNb alloy carbide film 84 of 2.0 μm was formed under the condition of an amount of introduced methane gas of 30 sccm exhibiting maximum hardness. In the gray-tone layer 85, the TiNb alloy carbide film of 0.3 μm was formed in which the methane gas was increased in a gradient manner from 30 sccm to 40 sccm.

TABLE 7

Corrosion Resistance of Carbide Film with 20 mass % Ti and 80 mass % Nb

| | CASS Test | Artificial Sweat Test | Sulfuric Acid | Hydrochloric Acid | Phosphoric Acid | NaOH 10% | Sodium hypochlorite |
|---|---|---|---|---|---|---|---|
| TiC (methane at 30 sccm) | Good | Good | Poor (peeling) | Poor | Poor (peeling) | Good | Good |
| NbC (methane at 30 sccm) | Good | Good | Good | Good | Good | Poor | Poor |
| NbTiC (methane at 30 sccm) | Good | Good | Good | Good | Good | Good | Good |

Furthermore, since Ti and Nb included in the gray-tone hard decorative member 70 are materials that do not induce an allergic reaction in the human body, the member can be used as an ornament in consideration for resistance to metal allergies.

Example 5

Fifth Example of the gray-tone hard decorative member of the present invention is explained with reference to FIG. 14 and FIG. 15. FIG. 14 is a cross-sectional schematic view of a gray-tone hard decorative member 80, and FIG. 15 is a view showing the measurement of the scratch resistance of the decorative member 80.

A sintered body having an alloy composition of 20 mass % Ti and 80 mass % Nb was used as a sputtering target, similarly to Example 4. As illustrated in FIG. 14, a Ti material specified in JIS2 class was used as a base 81, and an adhesion layer 82 of 0.1 μm comprising a lower oxide of a TiNb alloy was formed on the base 81 by a sputtering method. Then, a gradient adhesion layer 83 of 0.2 μm of a TiNb alloy oxycarbide film in which a methane gas was increased in a gradient manner while introducing a slight amount of oxygen gas was formed. Then, a hardening layer In the gradient adhesion layer 83 in the gray-tone hard decorative member 80 of Example 5, a definite interface between the adhesion layer and the hardening layer vanishes, and therefore, the base and the adhesion layer can be integrated. The presence of the gradient adhesion layer results in sufficient adhesiveness between the adhesion layer and the hardening layer and in a structure in which film stress is increased in a gradient manner, and therefore results in the effect of inhibiting generation of a crack and peeling due to stress strain, to improve scratch resistance and wear resistance and enables the thick hardening layer having high film hardness to be formed. Since scratch resistance is determined nearly by the product of the hardness, film thickness, and degree of adhesion with a base of a hardening layer layered on the base, scratch resistance can be improved by improving adhesiveness with the base.

The gray-tone layer 85 in the gray-tone hard decorative member 80 of Example 5 results in a mild change in the color tone due to increase in carbon content in a gradient manner, has high adhesiveness with the hardening layer 84, and also contributes to the effect of inhibiting peeling and making a scratch less noticeable even if the scratch is made.

FIG. 15 shows the results of the measured scratch resistance performance of the gray-tone hard decorative member 80 in Example 5. The figure shows, as comparisons, the results of the measured scratch resistances (root-mean-square roughnesses) of the decorative member 120 illustrated in FIG. 9 and produced based on Patent Literature 1, the gray-tone hard decorative member 80 of Example 5 according to the present invention, a Ti base specified in JIS2 class on which no hard film was formed, and the decorative member 110 in which the TiC film of 0.8 μm illustrated in FIG. 6, produced based on Non Patent Literature 1, and having hardness equivalent to HV1100 was formed on the Ti base. It was confirmed from FIG. 15 that the gray-tone hard decorative member 80 of Example 5 of the present invention had much better scratch resistance performance than the decorative member 120 produced based on Patent Literature 1 and the decorative member 110 produced based on Non Patent Literature 1 as well as the Ti base on which no hard film was formed.

Since scratch resistance performance is determined nearly by the product of the hardness, film thickness, degree of adhesion with a base, and hardness of the base of a hardening layer layered on the base, the TiC film (decorative member 110) produced as the comparison was wanted to be formed to have a film thickness of 2.0 μm or more; however, since a crack and peeling were observed in the film having a film thickness of 0.9 μm or more when the TiC film was formed on the base without being processed, the film thickness was set at 0.8 μm.

Similarly to Table 7 of Example 4, the results of the evaluation of the corrosion resistance in Example 5 show high corrosion resistance performance to acids and alkalis. The film hardness of the entire gray-tone hard decorative member 80 was HV2621. The film hardness of the hardening layer was higher than the film hardness of the gray-tone layer.

Example 6

Sixth Example of the gray-tone hard decorative member of the present invention is explained with reference to FIG. 16, FIG. 17, Table 8, Table 9, Table 10, and Table 11. FIG. 16 is a cross-sectional schematic view of a gray-tone hard decorative member 90, FIG. 17 is a view showing the measurement of the scratch resistance of the decorative member 90, Table 8 shows the results of hardness, color tones, a color tone difference (|a*−b*|), a difference between a maximum value and a minimum value in reflectance measurement in the visible region (360 to 740 nm), and determination of color tones in a carbide with 50 mass % Ti and 50 mass % Ta, Table 9 shows the measurement results of a TaC film, Table 10 shows the results of the measurement of the amount of carbon by ESCA, and Table 11 shows the results of the comparison of corrosion resistance.

A sintered body having an alloy composition of 50 mass % Ti and 50 mass % Ta was used as a sputtering target. As illustrated in FIG. 17 (Embodiment A), a Ti material specified in JIS2 class was used as a base 91, and an argon gas at 105 sccm and a methane gas at 50 sccm were introduced, to form a TiTa alloy carbide film 92 of 0.8 μm on the base 91 by a sputtering method and to produce the gray-tone hard decorative member 90. The appearance color of the gray-tone hard decorative member 90 obtained in such a manner exhibited a deep gray tone with L*: 71.82, a*: 1.16, and b*: 1.84 in Lab color space display.

Table 8 shows the results of hardness, lightness (L*), color tones (a*, b*), a difference between a* and b* (|a*−b*|), a difference between a maximum value and a minimum value in reflectance measurement in the visible region (360 to 740 nm), and determination of color tones in the TiTa alloy carbide film produced by changing the amount of methane gas in the TiTa alloy.

In addition, Table 9 shows, as comparisons, the results of hardness, lightness (L*), color tones (a*, b*), a difference between a* and b* (|a*−b*|), a difference between a maximum value and a minimum value in reflectance measurement in the visible region (360 to 740 nm), and determination of color tones in the TaC film produced by changing the amount of methane gas.

TABLE 8

Carbide Film with 50 mass % Ti and 50 mass % Ta

| Reactant Gas | Hardness | Results of Measurement of Color Tones | | | | Reflectance Difference (Maximum Value − Minimum Value) | Determination |
|---|---|---|---|---|---|---|---|
| CH₄ | HV | L* | a* | b* | |a* − b*| | | of Color Tones |
| 0 | 464 | 78.24 | 0.85 | 2.16 | 1.31 | 7.89 | Poor |
| 10 | 873 | 77.72 | 0.92 | 3.06 | 2.14 | 11.24 | Poor |
| 20 | 1110 | 76.17 | 1.21 | 3.66 | 2.45 | 13.05 | Poor |
| 30 | 1671 | 75.29 | 1.26 | 4.1 | 2.84 | 14.17 | Poor |
| 40 | 2229 | 74.49 | 1.34 | 3.89 | 2.55 | 13.61 | Poor |
| 50 | 2668 | 71.84 | 1.16 | 1.84 | 0.68 | 9.96 | Good |
| 60 | 2399 | 66.99 | 0.88 | 1.66 | 0.78 | 9.15 | Good |
| 70 | 1668 | 62.11 | 0.79 | 1.39 | 0.6 | 7.97 | Good |

TABLE 9

TaC Film

| Reactant Gas CH$_4$ | Hardness HV | Results of Measurement of Color Tones | | | | Reflectance Difference (Maximum Value − Minimum Value) | Determination of Color Tones |
|---|---|---|---|---|---|---|---|
| | | L* | a* | b* | \|a* − b*\| | | |
| 0 | 926 | 78.64 | 0.84 | 5.03 | 4.19 | 22.11 | Poor |
| 10 | 1415 | 78.01 | 1.3 | 4.00 | 2.7 | 16.47 | Poor |
| 20 | 2004 | 76.66 | 0.81 | 3.44 | 2.63 | 12.97 | Poor |
| 25 | 2476 | 76.63 | 0.78 | 3.35 | 2.57 | 12.8 | Poor |
| 30 | 2652 | 76.67 | 0.82 | 3.53 | 2.71 | 13.47 | Poor |
| 40 | 2961 | 76.32 | 1.87 | 8.99 | 7.12 | 27.32 | Poor |
| 45 | 2717 | 75.95 | 2.69 | 11.75 | 9.06 | 26.9 | Poor |
| 50 | 2667 | 70.8 | 4.5 | 12.3 | 7.8 | 31.3 | Poor |
| 65 | 2111 | 67 | 5.1 | 15.8 | 10.7 | 30.1 | Poor |

Table 8 reveals that the film with a deeper gray tone is obtained on the condition of introducing methane gas at 50 sccm or more in the TiTaC film. As a result of ESCA measurement, the amount of carbon existing in an alloy coating film at the time of the introduction of 50 sccm was 43.3 atm %.

Table 10 shows the results of quantitative determination of analysis of elements in a TiTaC film with ESCA analysis. Table 10 reveals that a gray color with a sense of high quality is obtained in a range of 43.3 atm % to 58.4 atm %.

TABLE 10

| Quantitative Measurement of Amount of Elements in 50 mass % Ti and 50 mass % Ta | | | | |
|---|---|---|---|---|
| CH$_4$ (sccm) | Ti | Ta | C | Others |
| 35 | 43.9 | 23.3 | 31.3 | 1.5 |
| 40 | 41.2 | 21.7 | 35.1 | 2 |
| 50 | 36 | 19.3 | 43.3 | 1.4 |
| 65 | 25.8 | 15.4 | 58.4 | 0.4 |

Table 2 shows that the TiC film is not able to be considered to be a decorative member having highly maintained scratch resistance and a deep gray tone because lightness L* is as low as 58.11, exhibiting an almost black color rather than a gray color, and in addition, the film hardness does not reach HV1500 or more although the values of the color tones (a*, b*) satisfy −2.0≤a*, b*≤2.0 and the difference between a* and b* (|a*−b*|) is 1.5 or less when methane gas is introduced at 65 sccm or more.

Table 9 shows that the TaC film is not able to be also considered to be a decorative member having highly maintained scratch resistance and a deep gray tone because both color tones (a*, b*) are increased in proportion to the amount of introduced methane gas, and the TaC film exhibits yellow to brown.

Only in a TiTaC film comprising an alloy of Ti and Ta, a gray-tone decorative member having high scratch resistance is obtained because the TiTaC film exhibits a deep gray tone and has a film hardness of HV1500 or more.

FIG. 17 is a view showing the measured scratch resistance of the gray-tone hard decorative member 90 produced in Example 6. The figure shows, as comparisons, the results of the measured scratch resistances (root-mean-square roughnesses) of a decorative member 110 in which a TiC film of 0.8 μm produced based on Non Patent Literature 1 and having hardness equivalent to HV1100 was formed on a JIS2 class Ti base, and a JIS2 class Ti base on which no hard film was formed. It was confirmed from FIG. 17 that the gray-tone hard decorative member 90 of Example 6 of the present invention had much better scratch resistance performance than the decorative member 110 produced based on Non Patent Literature 1 as well as the Ti base on which no hard film was formed. Since scratch resistance is determined nearly by the product of the hardness, film thickness, and degree of adhesion with a base of an entire hardening layer layered on the base, the decorative member 90 having hardness two times or more the hardness of the decorative member 110 can be improved in scratch resistance performance.

Since scratch resistance performance is determined nearly by the product of the hardness, film thickness, and degree of adhesion with a base of an entire hardening layer layered on the base, the scratch resistance performance is improved with increasing the film thickness. However, it was difficult to form each film having a thickness of 0.8 μm or more in view of adhesion and film stress in Example 1 and Comparative Example 1.

Table 11 shows the results of the evaluation of the corrosion resistance of the decorative member 90. As comparisons, the results of a TiC film and a TaC film produced by introducing gas having the same amount (methane gas at 50 sccm) are shown together. Table 11 reveals that a decorative film having high corrosion resistance in combination with each feature is obtained in a TaTiC carbide film in which Ti excellent in alkali resistance and sodium hypochlorite resistance and Ta excellent in acid resistance are alloyed.

TABLE 11

Corrosion Resistance of Carbide Film with 50 mass % Ti and 50 mass % Ta

| | CASS Test | Artificial Sweat Test | Sulfuric Acid | Hydrochloric Acid | Phosphoric Acid | NaOH 10% | Sodium hypochlorite |
|---|---|---|---|---|---|---|---|
| TiC (methane at 50 sccm) | Good | Good | Poor (peeling) | Poor | Poor (peeling) | Good | Good |
| TaC (methane at 50 sccm) | Good | Good | Good | Good | Good | Fair | Poor |
| TiTaC (methane at 50 sccm) | Good | Good | Good | Good | Good | Good | Good |

Furthermore, since Ti and Ta included in the gray-tone hard decorative member 90 are materials that do not induce an allergic reaction in the human body, the member can be used as an ornament in consideration for resistance to metal allergies.

Example 7

Seventh Example of the gray-tone hard decorative member of the present invention is explained with reference to FIG. 18 and FIG. 19. FIG. 18 is a cross-sectional schematic view of a gray-tone hard decorative member 100, and FIG. 19 is a view showing the measurement of the scratch resistance of the decorative member 100.

A sintered body having an alloy composition of 50 mass % Ti and 50 mass % Ta was used as a sputtering target, similarly to Example 6. As illustrated in FIG. 18, a Ti material specified in JIS2 class was used as a base 101, and an adhesion layer 102 of 0.1 μm comprising a lower oxide of a TiTa alloy was formed on the base 101 by a sputtering method. Then, a gradient adhesion layer 103 of 0.2 μm of a TiTa alloy oxycarbide film in which a methane gas was increased in a gradient manner while introducing a slight amount of oxygen gas was formed. Then, a hardening layer 104 of 1.6 μm comprising a TiTa alloy carbide film was formed. Then, a gray-tone layer 105 of 0.3 μm of a TiTa alloy carbide film in which a methane gas was increased in a gradient manner was formed. The appearance color of the gray-tone hard decorative member 100 obtained in Example 7 exhibited a deep gray tone with L*: 66.88, a*: 0.87, and b*: 1.64 in Lab color space display. The difference between a maximum value and a minimum value in the visible region (360 to 740 nm) in reflectance measurement was 8.75%.

For the adhesion layer 102 of the gray-tone hard decorative member 100, an oxygen gas was introduced at 3 sccm under the fixed condition of an argon gas at 105 sccm, to form a TiTa alloy lower oxide film of 0.1 μm. The formation of the TiTa alloy lower oxide can result in more adhesiveness with the base than the TiTa alloy film and in improvement in scratch resistance. In the gradient adhesion layer 103, the TiTa alloy oxycarbide film of 0.2 μm was formed in which the amount of introduced methane gas was increased in a gradient manner from 0 sccm to 50 sccm exhibiting maximum hardness while introducing an oxygen gas at 3 sccm. In the hardening layer 104, the TiTa alloy carbide film 104 of 1.6 μm was formed under the condition of an amount of introduced methane gas of 50 sccm exhibiting maximum hardness. In the gray-tone layer 105, the TiTa alloy carbide film of 0.3 μm was formed in which the methane gas was increased in a gradient manner from 50 sccm to 60 sccm.

In the gradient adhesion layer 103 in the gray-tone hard decorative member 100 of Example 7, a definite interface between the adhesion layer and the hardening layer vanishes, and therefore, the base and the adhesion layer can be integrated. The presence of the gradient adhesion layer results in sufficient adhesiveness between the adhesion layer and the hardening layer and in a structure in which film stress is increased in a gradient manner, and therefore results in the effect of inhibiting generation of a crack and peeling due to stress strain, to improve scratch resistance and wear resistance and enables the thick hardening layer having high film hardness to be formed. Since scratch resistance is determined nearly by the product of the hardness, film thickness, and degree of adhesion with a base of an entire hardening layer layered on the base, scratch resistance can be improved by improving adhesiveness with the base.

The gray-tone layer 105 in the gray-tone hard decorative member 100 of Example 7 results in a mild change in the color tone due to increase in carbon content in a gradient manner, has high adhesiveness with the hardening layer 104, and also contributes to the effect of inhibiting peeling and making a scratch less noticeable even if the scratch is made.

FIG. 19 shows the results of the measured scratch resistance performance of the gray-tone hard decorative member 100 in Example 7. The figure shows, as comparisons, the results of the measured scratch resistances (root-mean-square roughnesses) of the decorative member 120 illustrated in FIG. 9 and produced based on Patent Literature 1, the gray-tone hard decorative member 100 of Example 7 according to the present invention, a Ti base specified in JIS2 class on which no hard film was formed, and the decorative member 110 in which the TiC film of 0.8 μm illustrated in FIG. 6, produced based on Non Patent Literature 1, and having hardness equivalent to HV1100 was formed on the Ti base. It was confirmed from FIG. 19 that the gray-tone hard decorative member 100 of Example 7 of the present invention had much better scratch resistance performance than the decorative member 120 produced based on Patent Literature 1 and the decorative member 110 produced based on Non Patent Literature 1 as well as the Ti base on which no hard film was formed.

Since scratch resistance performance is determined nearly by the product of the hardness, film thickness, degree of adhesion with a base, and hardness of the base of an entire hardening layer layered on the base, the TiC film (decorative member 110) produced as the comparison was wanted to be formed to have a film thickness of 1.6 μm or more; however, since a crack and peeling were observed in the film having a film thickness of 0.9 μm or more when the TiC film was formed on the base without being processed, the film thickness was set at 0.8 μm.

Similarly to Table 11 of Example 6, the results of the evaluation of the corrosion resistance in Example 7 show high corrosion resistance performance to acids and alkalis. The film hardness of the entire gray-tone hard decorative member 100 was HV2440. The film hardness of the hardening layer was higher than the film hardness of the gray-tone layer.

In the examples mentioned above, the percentages of the metal elements in each layered layer were kept at those in a raw material sintered body. In addition, the percentages of the non-metallic elements in each layered layer varied depending on the amount of the reactant gas introduced during layering each layer. For example, the percentages of the non-metallic elements in the gray-tone gradient layer and the gradient adhesion layer were increased with increasing the amount of the reactant gas introduced during layering each of the layers.

REFERENCE SIGNS LIST

10 Hard decorative member
11 Base
15 Gray-tone layer
20 Hard decorative member
21 Base
22 Adhesion layer
25 Gray-tone layer
30 Hard decorative member
31 Base
32 Adhesion layer
33 Gradient adhesion layer
34 Hardening layer
35 Gray-tone layer
36 Surface, closer to hardening layer, in gradient adhesion layer
37 Surface, closer to hardening layer, in gray-tone layer

The invention claimed is:

1. A hard decorative member, comprising a base and a hard decorative coating film layered on the base, wherein
   the hard decorative coating film comprises a gray-tone layer comprising a compound formed by a reaction of an alloy of Ti and one or two or more metals M2 selected from Nb, Ta, and V with a non-metallic element comprising at least carbon;
   an amount of Ti contained in the gray-tone layer is 20 to 90 mass % in a total of Ti and the metal M2 of 100 mass %;
   the gray-tone layer has a hardness of HV1500 or more; and
   in the gray-tone layer, a difference between a maximum value and a minimum value is 10% or less in reflectance measurement in a visible region (360 to 740 nm), and lightness L* is 60<L*≤73, each of color tone values a* and b* is −2.0 to 2.0, and a difference between a* and b* is 1.5 or less in Lab color space display.

2. The hard decorative member according to claim 1, wherein an amount of carbon contained in the gray-tone layer is 30 to 70 atm % in a total of Ti, the metal M2, and the non-metallic element of 100 atm %.

3. The hard decorative member according to claim 1, wherein the gray-tone layer has a thickness of 0.2 μm or more.

4. The hard decorative member according to claim 1, wherein the hard decorative coating film further comprises an adhesion layer; and the adhesion layer is layered between the base and the gray-tone layer.

5. The hard decorative member according to claim 1, wherein an antifouling coating layer is further layered on the hard decorative coating film.

6. The hard decorative member according to claim 1, wherein in the total amount of the reaction compound included in the gray-tone layer, the amount of the non-metallic element is 29.9 to 49.1 atm %, assuming that the total amount of the non-metallic element, Ti, and the metal M2 is 100 atm %.

7. The hard decorative member according to claim 1, wherein in the gray-tone layer, the amount of the non-metallic element is increased with increasing a distance from the base while the total amount of Ti and the metal M2 is decreased with increasing a distance from the base.

8. A hard decorative member, comprising a base and a hard decorative coating film layered on the base,
   wherein the hard decorative coating film comprises a gray-tone layer comprising a compound formed by a reaction of an alloy of Ti and one or two or more metals M2 selected from Nb, Ta, and V with a non-metallic element comprising at least carbon;
   wherein the hard decorative coating film further comprises a hardening layer; the hardening layer is layered between the base and the gray-tone layer; and the hardening layer has higher hardness than the gray-tone layer.

9. A hard decorative member, comprising a base and a hard decorative coating film layered on the base,
   wherein the hard decorative coating film comprises a gray-tone layer comprising a compound formed by a reaction of an alloy of Ti and one or two or more metals M2 selected from Nb, Ta, and V with a non-metallic element comprising at least carbon;
   wherein the hard decorative coating film further comprises an adhesion layer, a gradient adhesion layer, and a hardening layer, each layer having two surfaces,
   wherein the adhesion layer, the gradient adhesion layer, the hardening layer, and the gray-tone layer are layered in this order on the base;
   wherein the gradient adhesion layer comprises a compound formed by a reaction of an alloy of Ti and one or two or more metals M2 selected from Nb, Ta, and V with one or two non-metallic elements selected from carbon and nitrogen, and an amount of the non-metallic element in the gradient adhesion layer is increased with increasing a distance from the base;
   wherein the hardening layer comprises a compound formed by a reaction of an alloy of Ti and one or two or more metals M2 selected from Nb, Ta, and V with one or two non-metallic elements selected from carbon and nitrogen, an amount of the non-metallic element in the hardening layer is equal to or more than a total amount of the carbon and the nitrogen in the one of the two surfaces of the gradient adhesion layer that is closer to the hardening layer, and the hardening layer has higher hardness than the gray-tone layer; and
   wherein an amount of the non-metallic element in the one of the two surfaces of the gray-tone layer that is closer to the hardening layer is equal to or more than an amount of the non-metallic element in the hardening layer.

10. The hard decorative member according to claim 8, wherein the hardening layer has a thickness of 0.5 to 4.0 μm.

* * * * *